United States Patent
Saze et al.

(10) Patent No.: US 7,116,744 B2
(45) Date of Patent: Oct. 3, 2006

(54) CLOCK RECOVERY CIRCUIT AND RECEIVER CIRCUIT FOR IMPROVING THE ERROR RATE OF SIGNAL REPRODUCTION

(75) Inventors: Takuya Saze, Kawasaki (JP); Hirotaka Tamura, Kawasaki (JP); Takaya Chiba, Sapporo (JP); Kohtaroh Gotoh, Kawasaki (JP); Hideki Ishida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 780 days.

(21) Appl. No.: 09/978,726

(22) Filed: Oct. 18, 2001

(65) Prior Publication Data

US 2002/0172304 A1    Nov. 21, 2002

(30) Foreign Application Priority Data

Mar. 29, 2001  (JP)  ............... 2001-096805
Apr. 17, 2001  (JP)  ............... 2001-118548

(51) Int. Cl.
*H04L 25/00*    (2006.01)
*H03L 7/06*    (2006.01)

(52) U.S. Cl. .................. 375/371; 327/147; 375/373

(58) Field of Classification Search ........... 375/371, 375/373, 375, 376, 355, 326; 327/147, 156
See application file for complete search history.

(56) References Cited

U.S. PATENT DOCUMENTS 4,535,459 A    8/1985  Hogge, Jr.
5,745,530 A *  4/1998  Baek et al. .................. 375/342
5,926,053 A *  7/1999  McDermott et al. ........ 327/298
5,948,083 A    9/1999  Gervasi
6,122,336 A *  9/2000  Anderson .................... 375/371

FOREIGN PATENT DOCUMENTS

| EP | 0 317 159 A2 | 5/1989 |
| EP | 0 758 171 A2 | 2/1997 |
| EP | 1 063 809 A2 | 6/2000 |
| EP | 1 061 691 A2 | 12/2000 |
| WO | 01/06696 A1 | 1/2001 |

OTHER PUBLICATIONS

European Search Report dated Feb. 28, 2006.

* cited by examiner

*Primary Examiner*—Kevin Kim
(74) *Attorney, Agent, or Firm*—Arent Fox PLLC

(57) ABSTRACT

A clock recovery circuit has a boundary detection/discrimination circuit to detect and discriminate a boundary in an input signal in accordance with a first signal. The clock recovery circuit performs clock recovery by controlling the timing of the first signal in accordance with the detected boundary, wherein boundary detection timing in the boundary detection/discrimination circuit is varied by controlling the first signal.

56 Claims, 34 Drawing Sheets

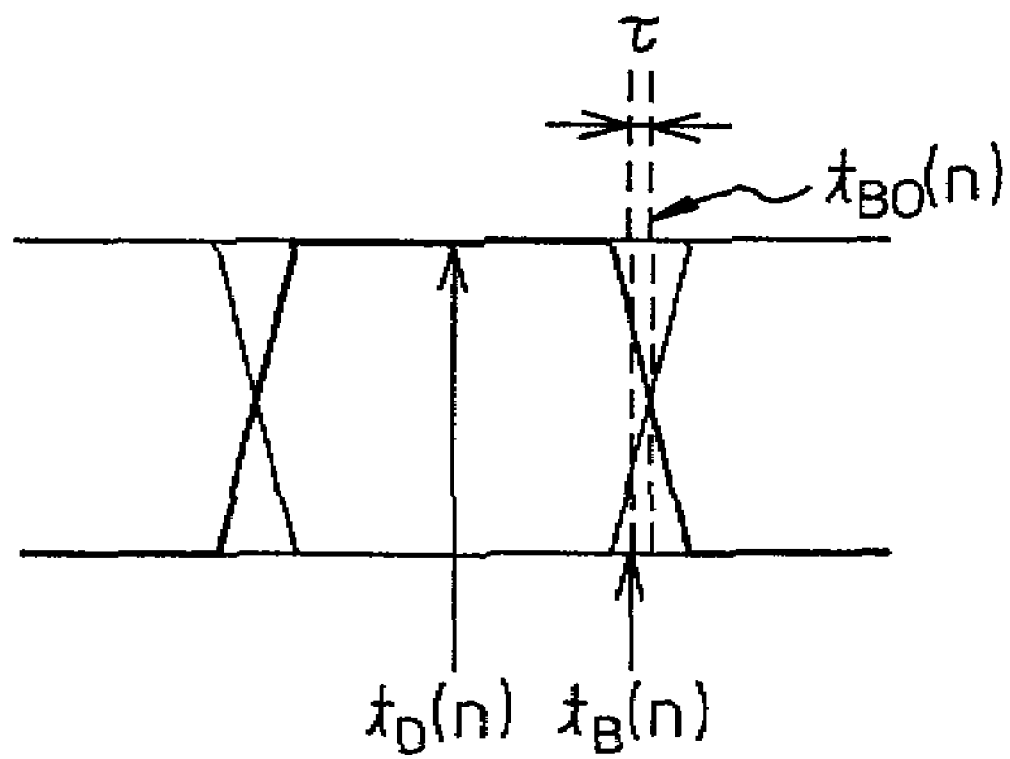

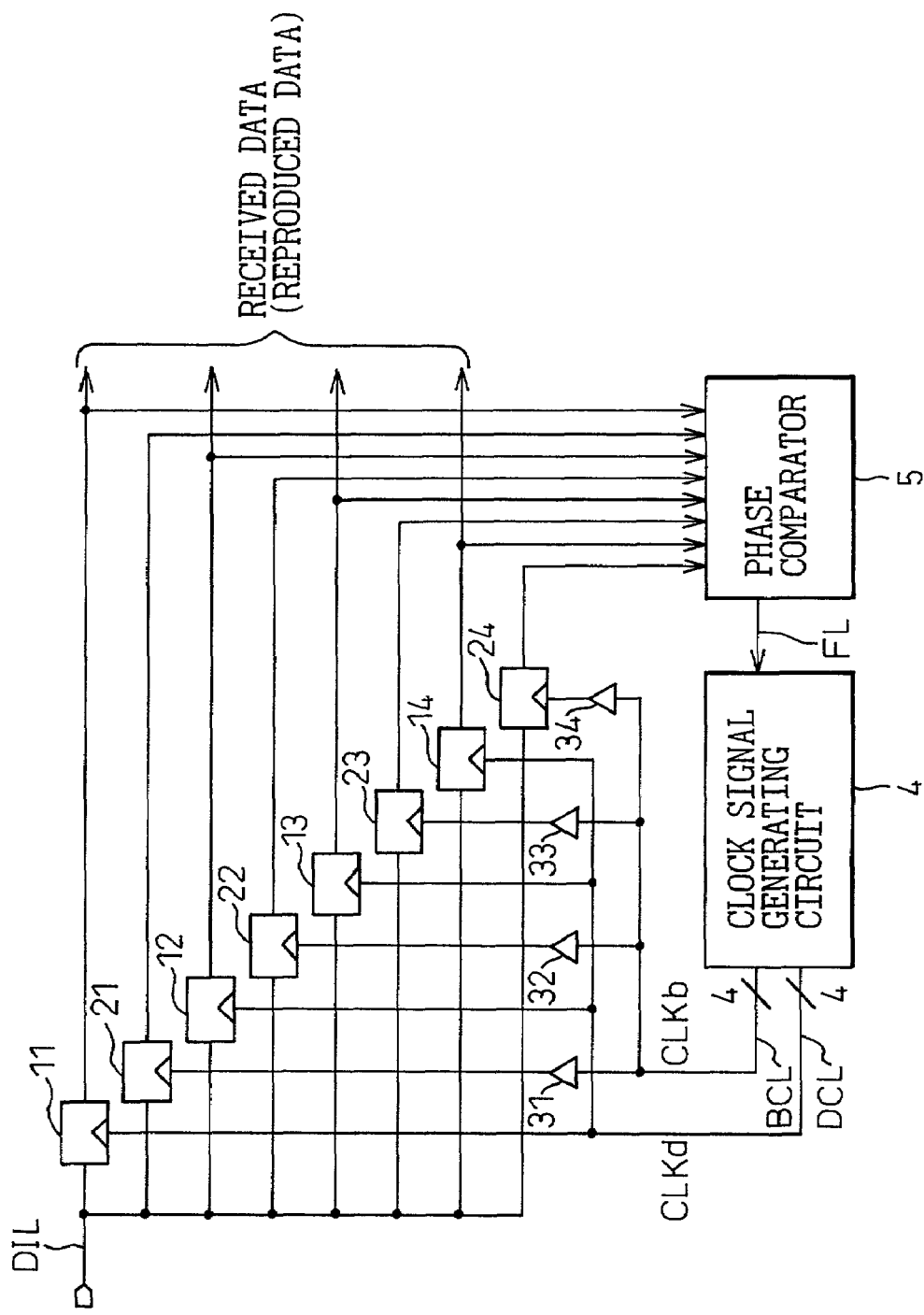

[SIMULATION FOR STABILITY PERFORMANCE]

CLOCK RECOVERY CIRCUIT AND RECEIVER CIRCUIT FOR IMPROVING THE ERROR RATE OF SIGNAL REPRODUCTION

BACKGROUND OF THE INVENTION

1. Field of the Invention

The present invention relates to a technology for enabling high-speed transmission of signals between a plurality of LSI chips or a plurality of devices or circuit blocks within a single chip, or between a plurality of boards or a plurality of cabinets, and more particularly, to a receiver circuit and a clock recovery circuit that uses a feedback loop type clock signal generating circuit.

2. Description of the Related Art

Recently, the performance of components used in computers and other information processing apparatuses has been greatly improved. In particular, dramatic improvements have been made, for example, in the performance of processors and semiconductor memory devices such as DRAMs (Dynamic Random Access Memories). The improvements in the performance of semiconductor memory devices, processors, and the like have reached the point where system performance cannot be improved further unless the speed of signal transmission between components or elements is increased.

Specifically, the speed of signal transmission between a main storage device such as a DRAM and a processor (i.e., between LSIs), for example, is becoming a bottleneck impeding performance improvement for a computer as a whole. Furthermore, the need for the improvement of signal transmission speed is increasing not only for signal transmission between cabinets or boards (printed wiring boards), such as between a server and a main storage device or between servers connected via a network, but also for signal transmission between chips or between devices or circuit blocks within a chip because of increasing integration and increasing size of semiconductor chips, decreasing supply voltage levels (low-voltage-swing signals), etc.

In order to address the increase in the amount of data transmission between LSIs or between boards or cabinets, signal transmission speed per pin must be increased. This is also necessary to avoid the increase in package cost, etc. due to an increased pin count. Consequently, inter-LSI signal transmission speeds exceeding 1 Gbps have been achieved in recent years, and it is expected that extremely high signal transmission speeds, such as 4 Gbps or even 10 Gbps, will be achieved in the future (three to eight years from now ).

In order to speed up the signal transmission between LSIs, for example, it is required that the receiver circuit operate with accurate timing for each incoming signal (for data detection and discrimination). It is known in the prior art to provide the signal receiver circuit with a clock recovery circuit that uses a feedback loop type clock signal generating circuit in order to generate a clock (internal clock) of such accurate timing. Here, the value of a phase adjusting weight for clock recovery is generated using, for example, a phase comparator which compares the phase of an external input clock with that of the internal clock.

In order to achieve high-speed signal transmission, it is desired to provide a clock recovery circuit and a receiver circuit wherein limit cycle signal amplitude is small and the jitter dependence and signal level dependence of feedback loop characteristics is reduced (to facilitate prediction of the circuit characteristics). Further, in such high-speed signal transmission, the transmitted signal waveform does not arrive as an ideal rectangular wave due to the characteristics of the transmission line, etc. making accurate signal reproduction difficult.

The prior art and its associated problems will be described in detail later with reference to drawings.

SUMMARY OF THE INVENTION

An object of the present invention is to provide a clock recovery circuit and a receiver circuit wherein limit cycle signal amplitude is small and the jitter dependence and signal level dependence of feedback loop characteristics is reduced. Another object of the invention is to provide a clock recovery circuit and a receiver circuit that can achieve signal reproduction with enhanced accuracy by adjusting the phase of a data detection clock.

According to the present invention there is provided a clock recovery circuit which includes a boundary detection/discrimination circuit for detecting or discriminating a boundary in an input signal in accordance with a first signal, and which performs clock recovery by controlling the timing of the first signal in accordance with the detected boundary, wherein boundary detection timing in the boundary detection/discrimination circuit is varied by controlling the first signal.

The boundary detection/discrimination circuit may detect the boundary in the input signal at a timing variably displaced from a timing at which the boundary should otherwise be detected. The boundary detection/discrimination circuit may detect the boundary in the input signal at a predetermined timing. The boundary detection/discrimination circuit may detect the boundary in the input signal at a dynamically controlled timing.

The clock recovery circuit may further comprise a phase interpolator for delaying the first signal by different times, and wherein modulation may be applied on a code supplied to the phase interpolator. The clock recovery circuit may further comprise a digital-to-analog converter for applying modulation on the code supplied to the phase interpolator, and wherein weighted modulation may be applied by the digital-to-analog converter. The clock recovery circuit may further comprise a variable delay circuit for delaying the first signal by different times.

The boundary detection/discrimination circuit may include a plurality of boundary detection units wherein each of the boundary detection units may detect a boundary in accordance with a boundary detection unit control signal. The each boundary detection unit may detect the boundary in the input signal at a timing variably displaced from the timing at which the boundary should otherwise be detected. The each boundary detection unit may detect the boundary in the input signal at a predetermined timing. The each boundary detection unit may detect the boundary in the input signal at a dynamically controlled timing.

The clock recovery circuit may further comprise a plurality of buffers for delaying the boundary detection unit control signals by respectively different times. The plurality of buffers may be constructed to provide different delay times by adjusting the ratio between the size of a capacitor as a load and the size of a transistor for driving the load in each of the buffers. The clock recovery circuit may further comprise a phase interpolator for delaying the boundary detection unit control signals by respectively different times, and wherein modulation may be applied on a code supplied to the phase interpolator. The clock recovery circuit may further comprise a digital-to-analog converter for applying modulation on the code supplied to the phase interpolator, and wherein weighted modulation may be applied by the digital-to-analog converter. The clock recovery circuit may further comprise a plurality of variable delay circuits for delaying the boundary detection unit control signals by respectively different times.

Further, according to the present invention, there is provided a receiver circuit comprising a data detection/discrimination circuit for detecting and discriminating data carried in an input signal; a boundary detection/discrimination circuit for detecting and discriminating a boundary appearing in the input signal; a phase comparator for receiving outputs from the data detection/discrimination circuit and the boundary detection/discrimination circuit, and for comparing the phases of the outputs; a clock signal generating circuit for receiving an output from the phase comparator, and for supplying a first internal clock to the data detection/discrimination circuit and a second internal clock to the boundary detection/discrimination circuit; and a boundary skew generating circuit for varying boundary detection timing in the boundary detection/discrimination circuit by controlling a skew given to the second internal clock.

The boundary skew generating circuit may supply the boundary detection/discrimination circuit with the second internal clock whose timing has been variably displaced from the timing at which the boundary in the input signal should otherwise be detected. The boundary skew generating circuit may give a predetermined skew to the second internal clock. The boundary skew generating circuit may give a dynamically varying skew to the second internal clock.

The boundary skew generating circuit may include a phase interpolator for delaying the second internal clock by different times, and wherein the skew may be controlled by applying modulation on a code supplied to the phase interpolator. The phase interpolator may include a digital-to-analog converter for applying modulation on the code, and wherein weighted modulation may be applied by the digital-to-analog converter. The boundary skew generating circuit may include a variable delay circuit for delaying the second internal clock by different times.

The boundary detection/discrimination circuit may include a plurality of boundary detection units wherein each of the boundary detection units may detect a boundary in accordance with a boundary detection unit control signal. The data detection/discrimination circuit may include a plurality of data detection units, and the first internal clock may include a plurality of data detection unit control signals of different phases wherein each of the data detection units may perform interleaving with each of the boundary detection units in accordance with each of the boundary detection unit control signals.

The boundary skew generating circuit may supply each boundary detection unit with a corresponding one of the boundary detection unit control signals whose timing has been variably displaced from the timing at which the boundary in the input signal should otherwise be detected. The boundary skew generating circuit may give a predetermined skew to the each boundary detection unit control signal. The boundary skew generating circuit may give a dynamically varying skew to the each boundary detection unit control signal. The boundary skew generating circuit may include a plurality of buffers for delaying the boundary detection unit control signals by respectively different times.

The boundary skew generating circuit may include a phase interpolator for delaying the boundary detection unit control signals by respectively different times, and wherein the skew may be controlled by applying modulation on a code supplied to the phase interpolator. The phase interpolator may include a digital-to-analog converter for applying modulation on the code, and wherein weighted modulation may be applied by the digital-to-analog converter. The boundary skew generating circuit may include a plurality of variable delay circuits for delaying the boundary detection unit control signals by respectively different times.

According to the present invention there is provided a clock recovery circuit for recovering a clock from an input signal by using a phase adjusting timing signal generating circuit in a feedback loop, comprising a displacing circuit for displacing an output of the phase adjusting timing signal generating circuit from an approximate center position of the input signal.

Further, according to the present invention there is also provided a clock recovery circuit for recovering a clock from an input signal by using a phase adjusting timing signal generating circuit in a feedback loop, comprising a displacing circuit for displacing an output of the phase adjusting timing signal generating circuit from an equispaced phase relationship.

A clock output from the data detection phase adjusting timing signal generating circuit may have a phase timing advanced or delayed with respect to the approximate center position of the input signal. The phase adjusting timing signal generating circuit may include a data detection phase adjusting timing signal generating circuit for generating a clock for detecting data carried in the input signal, and a changing point detection phase adjusting timing signal generating circuit for generating a clock for detecting a data changing point in the input signal.

The clock recovery circuit may further comprise an offset adding circuit, and wherein a control signal may be supplied to the changing point detection phase adjusting timing signal generating circuit, while the same control signal is supplied via the offset adding circuit to the data detection phase adjusting timing signal generating circuit. The clock recovery circuit may further comprise an offset subtracting circuit, and wherein a control signal may be supplied to the data detection phase adjusting timing signal generating circuit, while the same control signal is supplied via the offset subtracting circuit to the changing point detection phase adjusting timing signal generating circuit. The clock recovery circuit may further comprise a delay circuit, and wherein the output of the data detection phase adjusting timing signal generating circuit may be delayed through the delay circuit and the delayed output is used for the data detection.

The clock output from the data detection phase adjusting timing signal generating circuit may include a plurality of data detection unit control signals which are used in a plurality of data detection units to detect data carried in the input signal, and the clock output from the changing point detection phase adjusting timing signal generating circuit may include a plurality of changing point detection unit control signals which are used in a plurality of changing point detection units to detect data changing points in the input signal, and wherein each of the data detection units may perform interleaving with each of the changing point detection units. Each of the plurality of data detection unit control signals may have a phase timing advanced or delayed with respect to the approximate center position of the input signal.

According to the present invention there is provided a receiver circuit comprising a data detection/discrimination circuit for detecting or discriminating data carried in an input signal; a changing point detection/discrimination circuit for detecting or discriminating a changing point appearing in the input signal; a phase comparator circuit for receiving outputs from the data detection/discrimination circuit and the changing point detection/discrimination circuit, and for comparing the phases of the outputs; and a clock signal generating circuit for receiving an output from the phase comparator circuit, and for supplying a first internal clock to the data detection/discrimination circuit and a second internal clock to the changing point detection/discrimination circuit, and wherein the receiver circuit includes a displacing circuit for displacing the phase relationship between the first internal clock and the second internal clock from an equispaced phase relationship.

The first internal clock may have a phase timing advanced or delayed with respect to an approximate center position of the input signal. The clock signal generating circuit may include a data detection phase adjusting timing signal generating circuit for generating the first internal clock, and a changing point detection phase adjusting timing signal generating circuit for generating the second internal clock. The phase comparator circuit may supply a first control signal to the data detection phase adjusting timing signal generating circuit and a second control signal, different from the first control signal, to the changing point detection phase adjusting timing signal generating circuit.

The receiver circuit may further comprise an offset adjusting circuit, and wherein the output of the phase comparator circuit may be supplied to one of the data detection phase adjusting timing signal generating circuit and the changing point detection phase adjusting timing signal generating circuit, while the same output is supplied via the offset adjusting circuit to the other one of the data detection phase adjusting timing signal generating circuit and the changing point detection phase adjusting timing signal generating circuit. The offset adjusting circuit may be an offset adding circuit, and the offset adding circuit may be provided between the phase comparator circuit and the data detection phase adjusting timing signal generating circuit. The offset adjusting circuit may be an offset subtracting circuit, and the offset subtracting circuit may be provided between the phase comparator circuit and the changing point detection phase adjusting timing signal generating circuit.

The receiver circuit may further comprise a timing adjusting circuit wherein an output of the clock signal generating circuit may be supplied to one of the data detection phase adjusting timing signal generating circuit and the changing point detection phase adjusting timing signal generating circuit, while the same output is supplied via the timing adjusting circuit to the other one of the data detection phase adjusting timing signal generating circuit and the changing point detection phase adjusting timing signal generating circuit. The timing adjusting circuit may be a delay circuit, and the delay circuit may be provided between the data detection phase adjusting timing signal generating circuit and the clock signal generating circuit.

The data detection/discrimination circuit may include a plurality of data detection units, the changing point detection/discrimination circuit may include a plurality of changing point detection units, the first internal clock may include a plurality of data detection unit control signals of different phases, and the second internal clock may include a plurality of changing point detection unit control signals of different phases, and wherein each of the data detection units may perform interleaving with each of the changing point detection units. Each of the plurality of data detection unit control signals may have a phase timing advanced or delayed with respect to an approximate center position of the input signal.

BRIEF DESCRIPTION OF THE DRAWINGS

The present invention will be more clearly understood from the description of the preferred embodiments as set forth below with reference to the accompanying drawings, wherein:

FIG. 5 is a diagram for explaining the operation of the receiver circuit of FIG. 4 (including the clock recovery circuit);

FIG. 8 is a block diagram schematically showing a first embodiment of a receiver circuit according to the present invention;

DESCRIPTION OF THE PREFERRED EMBODIMENTS

Before describing a first mode of the present invention, a prior art clock recovery circuit and receiver circuit corresponding to the first mode of the invention and their associated problems will be described with reference to accompanying drawings.

Figure 1:
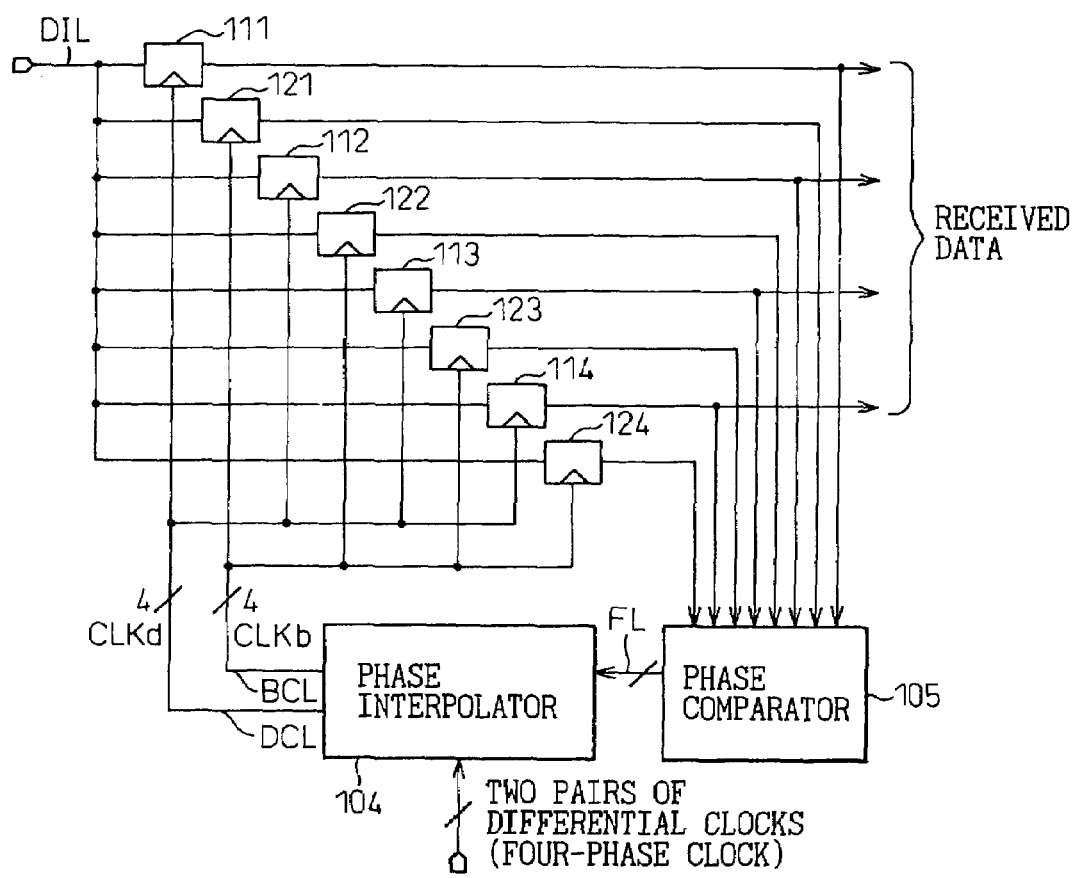
FIG. 1 is a block diagram schematically illustrating one example of a receiver circuit, including a clock recovery circuit, according to the prior art.

FIG. 1 is a block diagram schematically illustrating one example of the prior art receiver circuit, including a clock recovery circuit, wherein the circuit is configured as a 4-way×2 type interleaving circuit. In FIG. 1, reference numerals 111 to 114 are data detection units, 121 to 124 are boundary detection units, 104 is a phase interpolator, and 105 is a phase comparator. Further, reference character DIL is a data input line, DCL is a data detection clock line, BCL is a boundary detection clock line, and FL is a feedback line.

As shown in FIG. 1, in the prior art clock recovery circuit (receiver circuit), two pairs of differential clock signals are supplied as a four-phase input signal (four-phase clock) to the phase interpolator (phase adjusting timing signal generating circuit) 104 which integrates and compares the weighted sum of the inputs and generates clocks (CLKd and CLKb) of the phases corresponding to the weight value. The clock CLKd consists of four data detection unit control signals CLKd1, CLKd2, CLKd3, and CLKd4, each with a phase difference of 90 degrees, for example, and these control signals are supplied to the respective data detection units (data detection/discrimination circuits) 111 to 114.

On the other hand, the clock CLKb consists of four boundary detection unit control signals CLKb1, CLKb2, CLKb3, and CLKb4, each with a phase difference of 90 degrees, for example, and these control signals are supplied to the respective boundary detection units (boundary detection/discrimination circuits) 121 to 124. The data detection unit control signals CLKd1, CLKd2, CLKd3, and CLKd4 have a phase difference of 45 degrees relative to the respective boundary detection unit control signals CLKb1, CLKb2, CLKb3, and CLKb4.

Accordingly, when data is supplied on the data input line DIL at a rate of 2.5 G [bps], for example, the data detection units 111 to 114 and boundary detection units 121 to 124 perform interleaving by being driven with a 625-MHz clock.

The data detection units 111 to 114 are each driven, for example, with a 625-MHz clock (data detection unit control signal CLKd1, CLKd2, CLKd3, or CLKd4), detect and discriminate the data carried in the input signal supplied on the data input line DIL, and output the data as received data (reproduced data). The outputs of the data detection units 111 to 114 are also supplied to the phase comparator 105.

Likewise, the boundary detection units 121 to 124 are each driven, for example, with a 625-MHz clock (boundary detection unit control signal CLKb1, CLKb2, CLKb3, or CLKb4), detect and discriminate data boundaries appearing in the input signal supplied on the data input line DIL, and supply the result to the phase comparator 105.

The phase comparator 105 compares the outputs of the data detection units 111 to 114 and boundary detection units 121 to 124 based on digital "0s" or "1s", and supplies (feeds back) a feedback signal to the phase interpolator 104 via the feedback line FL.

Figure 2:
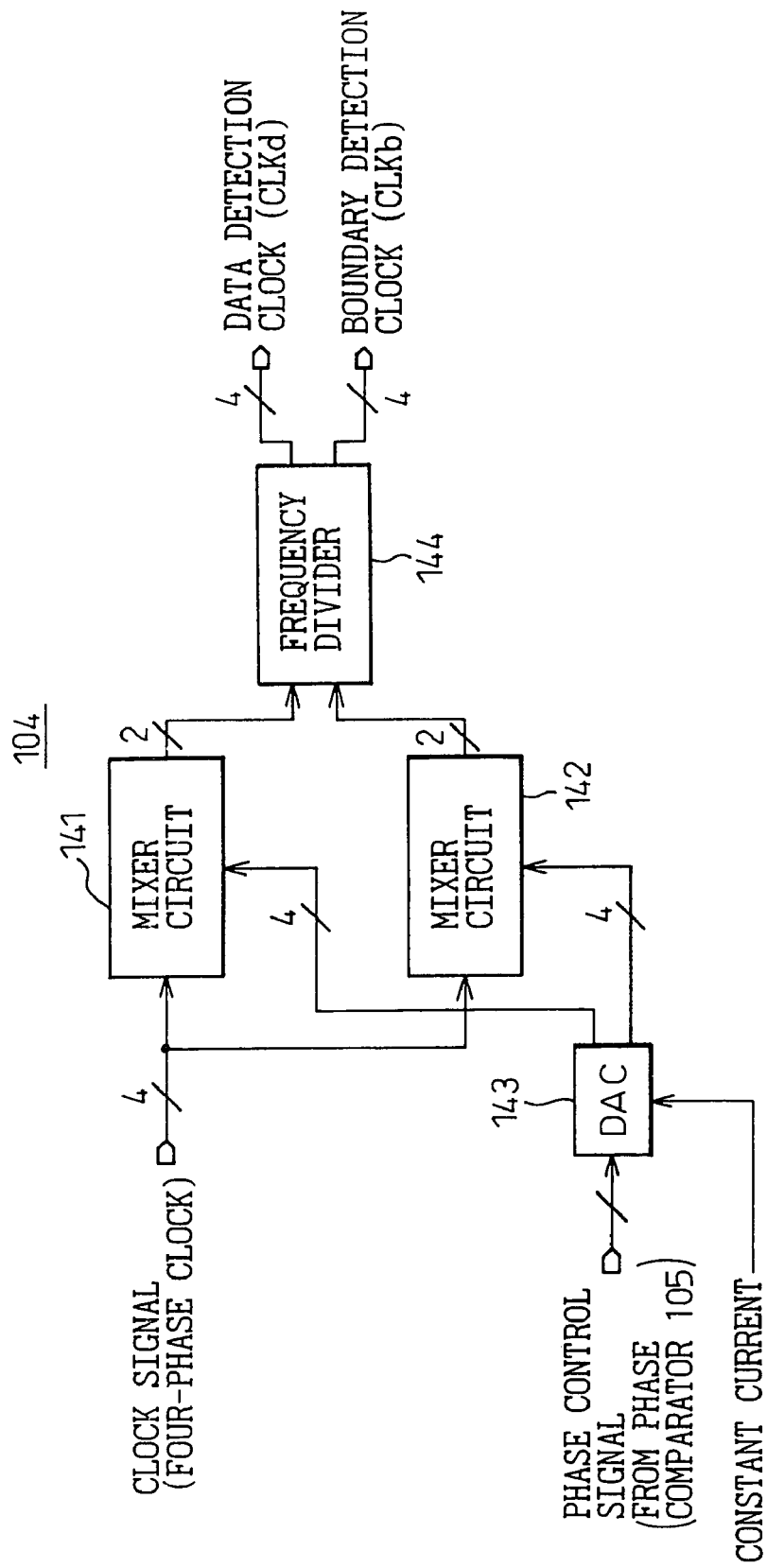
FIG. 2 is a block diagram showing one configuration example of a phase interpolator in the receiver circuit of FIG. 1.

FIG. 2 is a block diagram showing one configuration example of the phase interpolator in the receiver circuit.

As shown in FIG. 2, the phase interpolator 104 comprises mixer circuits 141 and 142, a digital-to-analog converter (DAC) 143, and a frequency divider 144. The mixer circuits 141 and 142 each receive a clock signal (four-phase clock) and an output of the DAC 143, synthesize from the four-phase clock a pair of signals differing in phase by 90 degrees, create a phase intermediate between them, generate a clock by applying the phase shift defined by a weight (the output of the DAC 143) to a signal having the intermediate phase, and generate the data detection clock CLKd (CLKd1, CLKd2, CLKd3, CLKd4) and boundary detection clock CLKb (CLKb1, CLKb2, CLKb3, CLKb4) through the frequency divider 144.

The mixer circuits 141 and 142 each control the phase based on a current value representing the weight; here, the weight for the phase adjustment is created by digitally comparing the phases of the external input clock and internal clock (the data detection clock CLKd and boundary detection clock CLKb) in the phase comparator (105) based on the outputs of the data detection units 111 to 114 and boundary detection units 121 to 124, and is supplied as a phase control signal to the DAC 143.

The DAC 143 receives a constant current as well as the phase control signal (the output of the phase comparator 105), converts the phase adjusting weight into the current, and supplies the current to the mixer circuits 141 and 142. The phases of the clocks CLKd and CLKb are adjusted based on the amount of change of the current.

Here, the term "clock recovery circuit" is used by focusing attention on the fact that the data detection clock is recovered from the input signal, while the term "receiver circuit" is used by focusing attention on the fact that the data detection/discrimination circuit, using the recovered clock, detects and discriminates the data carried in the input signal, and outputs the data as the received data.

In the receiver circuit (clock recovery circuit) shown in FIGS. 1 and 2, if the boundary detection units 121 to 124 used for phase comparison (clock recovery) are constructed from the same circuits as those used to construct the data detection units 111 to 114, systematic phase shifting does not occur, so that not only can the clock recovery be achieved with high accuracy, but the sensitivity of the phase comparison can also be enhanced.

Figure 3:
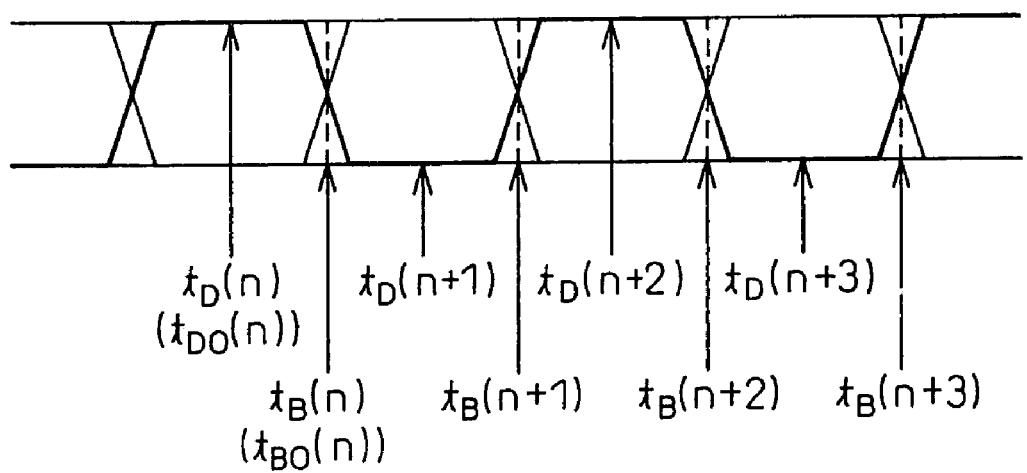
FIG. 3 is a diagram showing an example of latch timing for input signal data and boundaries.

FIG. 3 is a diagram showing an example of latch timing for input signal data and boundaries.

In FIG. 3, reference characters $t_D(n)$ ($t_{DO}(n)$), $t_D(n+1)$, $t_D(n+2)$, and $t_D(n+3)$ indicate the ideal timings for the data latched (detected) by the data detection units 111, 112, 113, and 114, while $t_B(n)$ ($t_{BO}(n)$), $t_B(n+1)$, $t_B(n+2)$, and $t_B(n+3)$ indicate the ideal timings for the boundaries latched by the boundary detection units 121, 122, 123, and 124.

In the prior art receiver circuit (clock recovery circuit) described with reference to FIGS. 1 to 3, because of large nonlinearities in the input/output characteristics of the phase comparator 105, feedback control for clock recovery entails limit cycle oscillations inherent in the so-called bang-bang control. The prior art receiver circuit also has the disadvantage that the circuit bandwidth varies depending on the magnitude of the jitter input to the clock recovery circuit.

Embodiments of a clock recovery circuit and a receiver circuit according to the present invention will be described below with reference to accompanying drawings.

Figure 4:
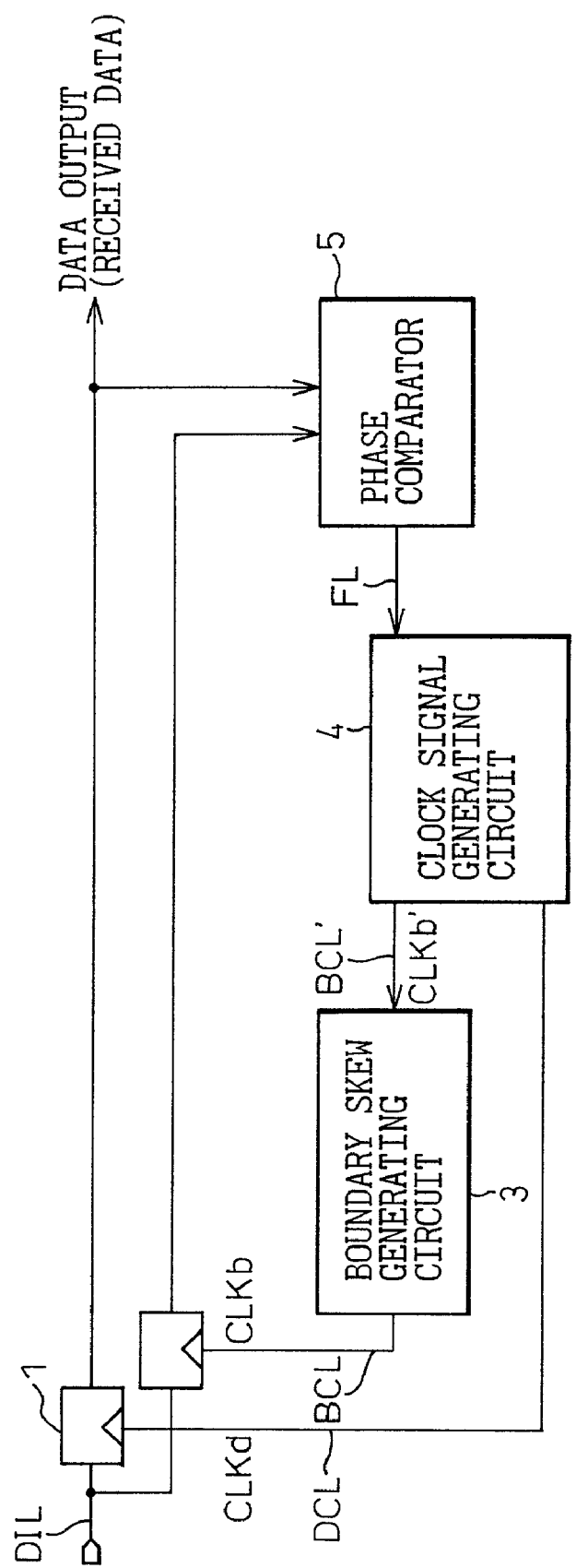
FIG. 4 is a block diagram showing the basic functional configuration of a receiver circuit, including a clock recovery circuit, according to a first mode of the present invention.

FIG. 4 is a block diagram showing the basic functional configuration of a receiver circuit, including a clock recovery circuit, according to the first mode of the present invention, and FIG. 5 is a diagram for explaining the operation of the receiver circuit of FIG. 4 (including the clock recovery circuit). In FIG. 4, reference numeral 1 is a data detection circuit, 2 is a boundary detection circuit, 3 is a boundary skew generating circuit, 4 is a clock signal generating circuit, and 5 is a phase comparator. Further, reference character DIL is a data input line, DCL is a data detection clock line, and BCL and BCL' are boundary detection clock lines, and FL is a feedback line.

In the clock recovery circuit (receiver circuit) of the invention shown in FIG. 4, the clock signal generating circuit 4 generates data detection clock CLKd and boundary detection clock CLKb'. The data detection clock CLKd is supplied to the data detection unit 1 via the data detection clock line DCL. On the other hand, the boundary detection clock CLKb' is supplied to the boundary skew generating circuit 3 via the boundary detection clock line BCL', and a boundary detection clock CLKb with a prescribed skew provided to it by the boundary skew generating circuit 3 is supplied to the boundary detection unit via the boundary detection clock line BCL.

The phase comparator 5 compares the outputs of the data detection circuit 1 and boundary detection circuit 2, and supplies (feeds back) a feedback signal to the clock signal generating circuit 4 via the feedback line FL.

As shown in FIG. 5, according to the clock recovery circuit of the present invention, the clock CLKb' output from the clock signal generating circuit 4 is input into the boundary skew generating circuit 3 where the prescribed skew (prescribed time quantity τ) is applied to it, and the resulting boundary detection clock CLKb is supplied to the boundary detection circuit 2, thereby effectively shifting the boundary detection timing $t_B(n)$ by τ forward or backward relative to the original boundary detection timing $t_{BO}(n)$.

The phase comparator 5 makes decisions to determine a phase lead or phase lag over a number of consecutive bit cells, and the sum is produced as the output of the phase comparator 5. In these decision operations, a different skew is deliberately given to the decision timing for each decision operation, and the timing position $t_B(n)$ is determined which is shifted by the skew τ from the original boundary decision timing $t_{BO}(n)$.

FIGS. 6A to 6D are diagrams for explaining the operation of the phase comparator in the receiver circuit (clock recovery circuit) of the present invention.

Figure 6A:
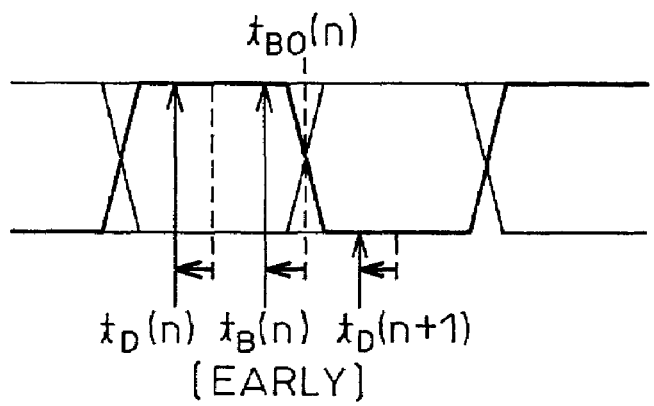
FIGS. 6A, 6B, 6C, and 6D are diagrams for explaining the operation of a phase comparator in the receiver circuit of the present invention.
Figure 6B:
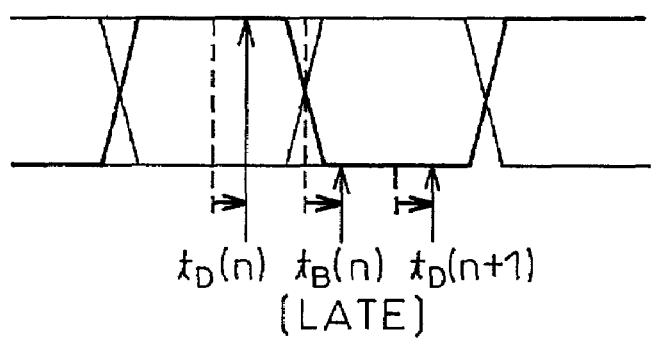

FIG. 6A shows the case [EARLY] where the latch timing $t_B(n)$, $t_D(n)$ by the internal clock is earlier than the ideal latch timing $t_{BO}(n)$, $t_{DO}(n)$, and FIG. 6B shows the case [LATE] where the latch timing $t_B(n)$, $t_D(n)$ by the internal clock is later than the ideal latch timing $t_{BO}(n)$, $t_{DO}(n)$.

Figure 6C:
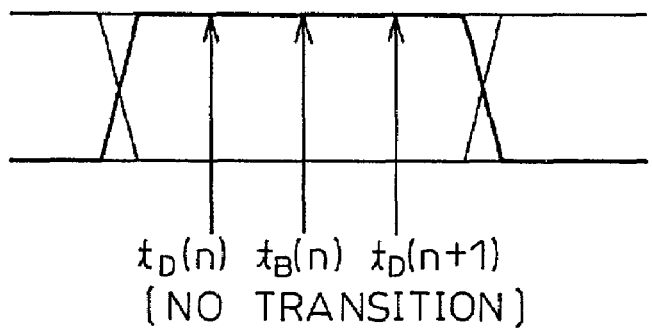
Figure 6D:
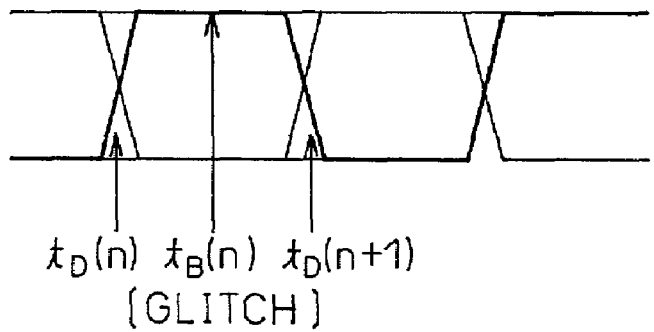

Further, FIG. 6C shows the case [NO TRANSITION] where any transition (from a "0" to a "1" or from a "1" to a "0") does not appear between data (data detection timing $t_D(n)$) and the next data (data detection timing $t_D(n+1)$), where n refers to the bit-cell order. Specifically, the same data appears in succession, and FIG. 6D shows the case [GLITCH] where, for example, when the same data appears in succession, the boundary detection circuit has latched noise occurring at a boundary position, the data detection circuit has detected a boundary position, or the boundary detection circuit has detected a data position. The relationship between the data detection timing $t_D(n)$ and the boundary detection timing $t_B(n)$ is shown in Table 1 below.

TABLE 1

| Timing | | Decision Results | |
|---|---|---|---|
| $t_D$ (n) | $t_B$ (n) | $t_D$ (n + 1) | STATE |
| 1 | 1 | 0 | EARLY |
| 0 | 0 | 1 | EARLY |
| 1 | 0 | 0 | LATE |
| 0 | 1 | 1 | LATE |
| 1 | 1 | 1 | NO TRANSITION |
| 0 | 0 | 0 | NO TRANSITION |
| 0 | 1 | 1 | GLITCH |
| 1 | 0 | 1 | GLITCH |

$t_D(n)$: Data detection timing for the n-th bit cell
$t_B(n)$: Boundary detection timing for the n-th bit cell According to the receiver circuit (clock recovery circuit) of the present invention, the boundary detection clock CLKb output from the clock signal generating circuit 4 is shifted forward or backward relative to the original boundary detection timing $t_{BO}(n)$; as a result, the input/output characteristic of the phase comparator 5 exhibits a staircase pattern consisting of a number of steps, not a single-step pattern, and this improves the linearity of the phase comparator 5 and serves to stabilize the feedback circuit operation for clock recovery.

Figure 7A:
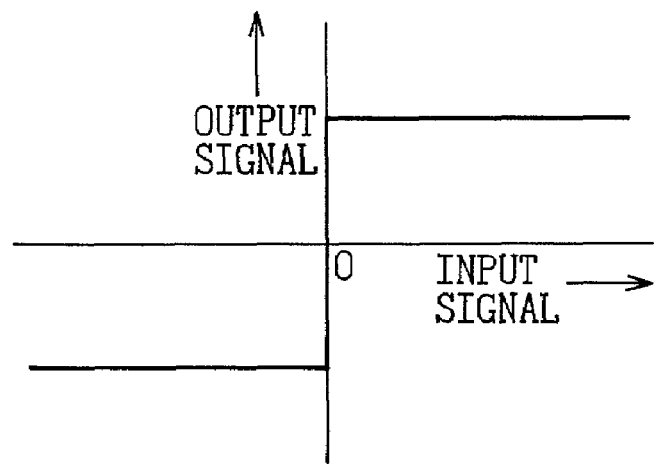
FIGS. 7A and 7B are diagrams for explaining one example of the operation of the receiver circuit according to the present invention.
Figure 7B:
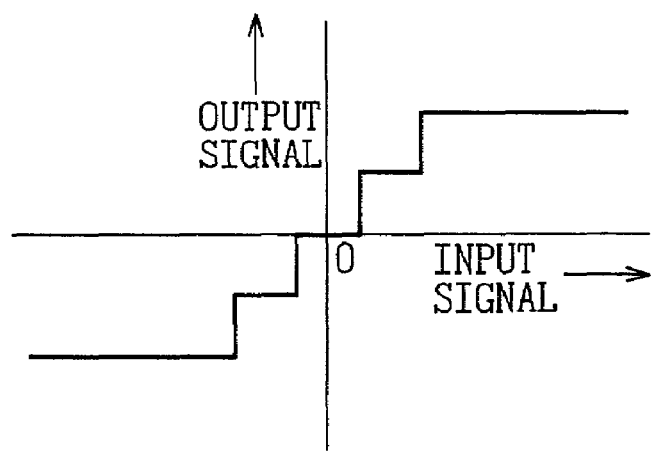

FIGS. 7A and 7B are diagrams for explaining one example of the operation of the receiver circuit according to the present invention: FIG. 7A shows a nonlinear input/output characteristic, and FIG. 7B shows a staircase-like input/output characteristic.

The circuit of FIG. 4 which shows the basic functional configuration of the invention differs from the prior art clock recovery circuit by the inclusion of the boundary skew generating circuit 3 with provisions made to shift the boundary detection timing forward or backward relative to the original timing.

The phase comparator 5 makes decisions to determine a phase lead or phase lag over a number of consecutive bit cells, and the sum is produced as the output of the phase comparator 5. In the present invention, a different skew is deliberately given to the decision timing for each decision operation.

As an example, a description will be given of the case where skews of $-3/2\tau$, $-1/2\tau$, $1/2\tau$, and $3/2\tau$, relative to the original boundary detection timing, are created through buffer delays. In this case, the input/output characteristic of the phase comparator exhibits a staircase pattern consisting of four steps as shown in FIG. 7B. This characteristic can be interpreted as having an improved linearity compared with the prior art nonlinear input/output characteristic consisting of a single step (see FIG. 7A). In this example, a characteristic substantially linear over the time duration $4\tau$ can be obtained. Therefore, if the value of $4\tau$ is set approximately equal to the maximum value of the jitter input to the system, the phase comparator 5 can always be operated within a linear range. As a specific example, if the value of $4\tau$ is set approximately equal to 0.5 UI (Unit Interval: Data clock period, for example, the clock period of a 2.5 GHz external clock), that would suffice for practical purposes.

Since the phase comparator of the present invention has an input/output characteristic of improved linearity compared with the prior art clock recovery circuit (receiver circuit) having a single-step nonlinear characteristic, the predictability of the characteristics of the clock recovery circuit can be improved by reducing not only the amplitude of the limit cycle signal inherent in a nonlinear system but also the jitter dependence and signal level dependence of the feedback loop characteristic.

FIG. 8 is a block diagram schematically showing a first embodiment of a receiver circuit according to the present invention, wherein the circuit is configured as a 4-way×2 type interleaving circuit. In FIG. 8, reference numerals 11 to 14 are data detection units, 21 to 24 are boundary detection units, 31 to 34 are boundary skew generating units (buffer delay circuits), 4 is a clock signal generating circuit, and 5 is a phase comparator. Further, reference character DIL is a data input line, DCL is a data detection clock line, BCL is a boundary detection clock line, and FL is a feedback line.

As shown in FIG. 8, similarly to the earlier described prior art receiver circuit, the receiver circuit (clock recovery circuit) of the first embodiment comprises four data detection units 11 to 14 and four boundary detection units 21 to 24, and the data detection units 11 to 14 and boundary detection units 21 to 24 perform interleaving. Here, the clock CLKd consists of four data detection unit control signals CLKd1, CLKd2, CLKd3, and CLKd4, each with a phase difference of 90 degrees, for example, and these control signals are supplied to the four data detection units (data detection/discrimination circuits) 11 to 14, respectively.

On the other hand, the clock CLKb consists of four boundary detection unit control signals CLKb1, CLKb2, CLKb3, and CLKb4, each with a phase difference of 90 degrees, for example, and these control signals are supplied to the four boundary detection units (boundary detection/discrimination circuits) 21 to 24, respectively. The data detection unit control signals CLKd1, CLKd2, CLKd3, and CLKd4 have a phase difference of 45 degrees relative to the respective boundary detection unit control signals CLKb1, CLKb2, CLKb3, and CLKb4.

Accordingly, when data is supplied on the input data line DIL at a rate of 2.5 G [bps], for example, the data detection units 11 to 14 and boundary detection units 21 to 24 perform interleaving by being driven with a 625-MHz clock.

The data detection units 11 to 14 are each driven, for example, with a 625-MHz clock (data detection unit control signal CLKd1, CLKd2, CLKd3, or CLKd4), detect and discriminate the data carried in the input signal supplied on the data input line DIL, and output the data as received data (reproduced data). The outputs of the data detection units 11 to 14 are also supplied to the phase comparator 5.

Likewise, the boundary detection units 21 to 24 are each driven, for example, with a 625-MHz clock (boundary detection unit control signal CLKb1, CLKb2, CLKb3, or CLKb4), detect and discriminate data boundaries appearing in the input signal supplied on the data input line DIL, and supply the result to the phase comparator 5.

The phase comparator 5 compares the outputs of the data detection units 11 to 14 and boundary detection units 21 to 24, and supplies (feeds back) a feedback signal to the clock signal generating circuit 4 via the feedback line FL.

Figure 9:
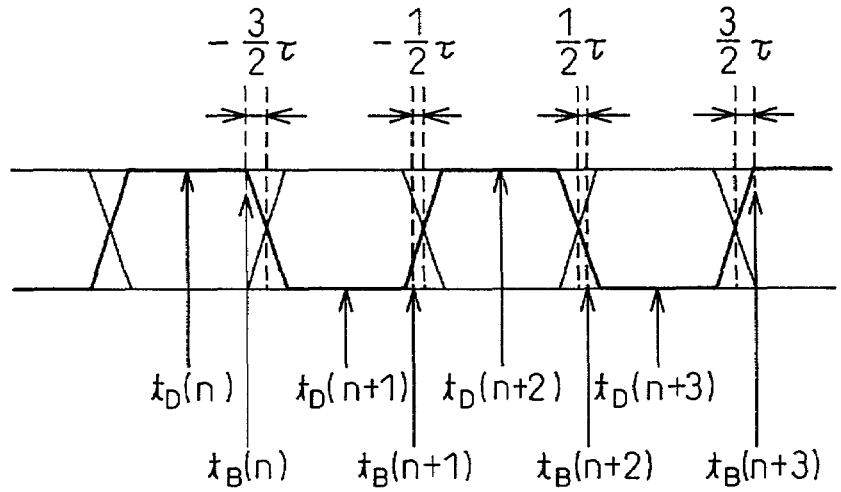
FIG. 9 is a diagram for explaining the operation of the receiver circuit of FIG. 8.

FIG. 9 is a diagram for explaining the operation of the receiver circuit of FIG. 8. As is apparent from a comparison between FIG. 9 and the previously given FIG. 3, in the receiver circuit (clock recovery circuit) of the first embodiment the boundary skew generating units 31, 32, 33, and 34 provide skews of $-3/2\tau$, $-1/2\tau$, $1/2\tau$, and $3/2\tau$ in this order to the boundary latch timings of the boundary detection units 21, 22, 23, and 24, where $\tau$ is a predefined time quantity, thereby shifting the boundary latch timings by the respective values relative to their original timings (ideal timings).

That is, when the skews due to buffer delays are set to $-3/2\tau$, $-1/2\tau$, $1/2\tau$, and $3/2\tau$, in this order, relative to the respective original boundary timings, where $\tau$ is the predefined time quantity, then an improvement in linearity can be expected as shown by the staircase-like characteristic consisting of four steps previously given in FIG. 7. This linearization can be achieved over a skew range of $2\tau$, that is, over a range of $4\tau$ in terms of magnitude. This quantity of $4\tau$ has, at a minimum, a magnitude equal to the jitter amount given to the system. As a specific example, the quantity of $4\tau$ is set approximately equal to 0.5 UI.

Compared with the single-step nonlinear input/output characteristic of the prior art phase comparator shown in FIG. 7A, by providing the skews the staircase-like input/output characteristic consisting of four steps shown in FIG. 7B can be achieved, achieving an improvement in the linearity of the phase comparator 5. With this improvement in the linearity of the phase comparator, the predictability of the characteristics of the clock recovery circuit (receiver circuit) can be improved by reducing not only the amplitude of the limit cycle signal inherent in a nonlinear system but also the jitter dependence and signal level dependence of the feedback loop characteristic.

Figure 10:
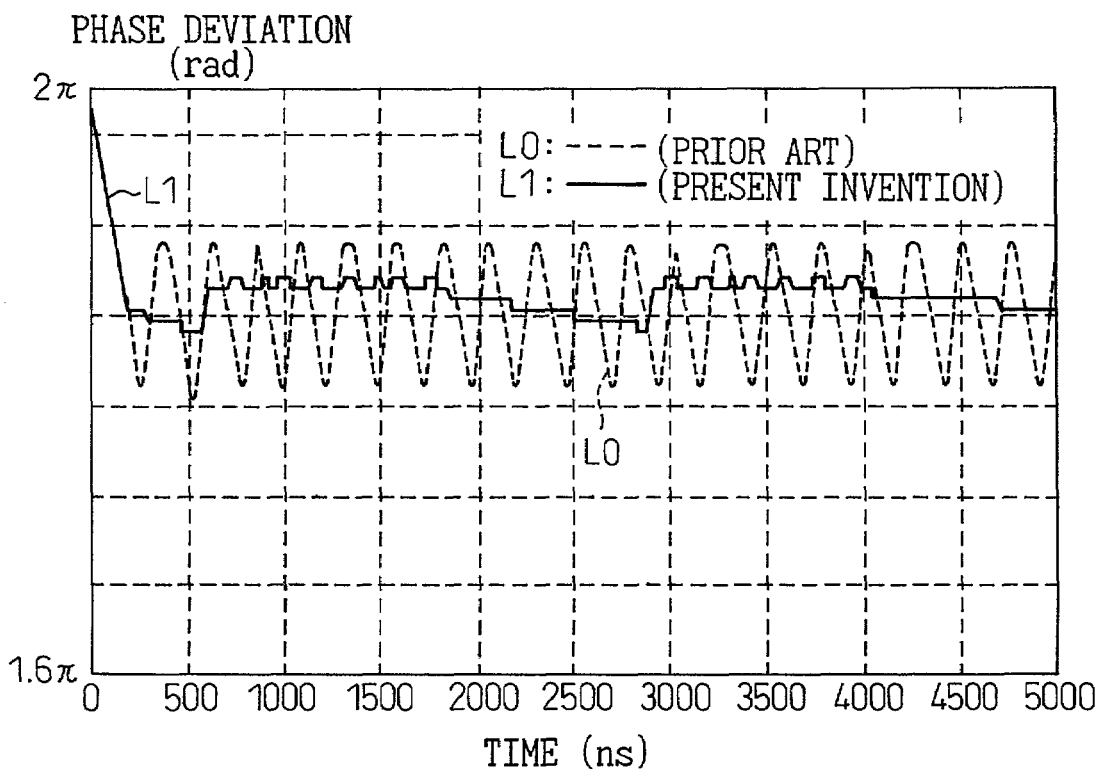
FIG. 10 is a diagram showing by way of example the results of simulations for the phase stability performance of the receiver circuit, the simulations being based on clock recovery circuit models, one according to the present invention and the other according to the prior art for comparison.

FIG. 10 is a diagram showing, by way of example, the results of simulations for the phase stability performance of the receiver circuit, the simulations being based on clock recovery circuit models, one according to the present invention and the other according to the prior art for comparison; more specifically, the phase stability performance was simulated by creating models using the C language. In FIG. 10, data of a pattern "1, 0, 1, 0, . . ." was input, and the amplitude due to the bang-bang control in each clock recovery circuit model was observed.

In FIG. 10, reference character L0 (dashed line) shows the simulation result for the prior art receiver circuit, and L1 (solid line) indicates the simulation result for the receiver circuit of the present invention. Further, in FIG. 10, phase deviation (fluctuation in timing) is plotted along the vertical axis, and the time along the horizontal axis.

As can be seen from FIG. 10, in the present invention (first embodiment: L1) the fluctuation in data latch timing (phase deviation) is reduced compared with the prior art (L0), and it is clear that the clock recovery circuit of the present invention achieves a higher stability.

Figure 11:
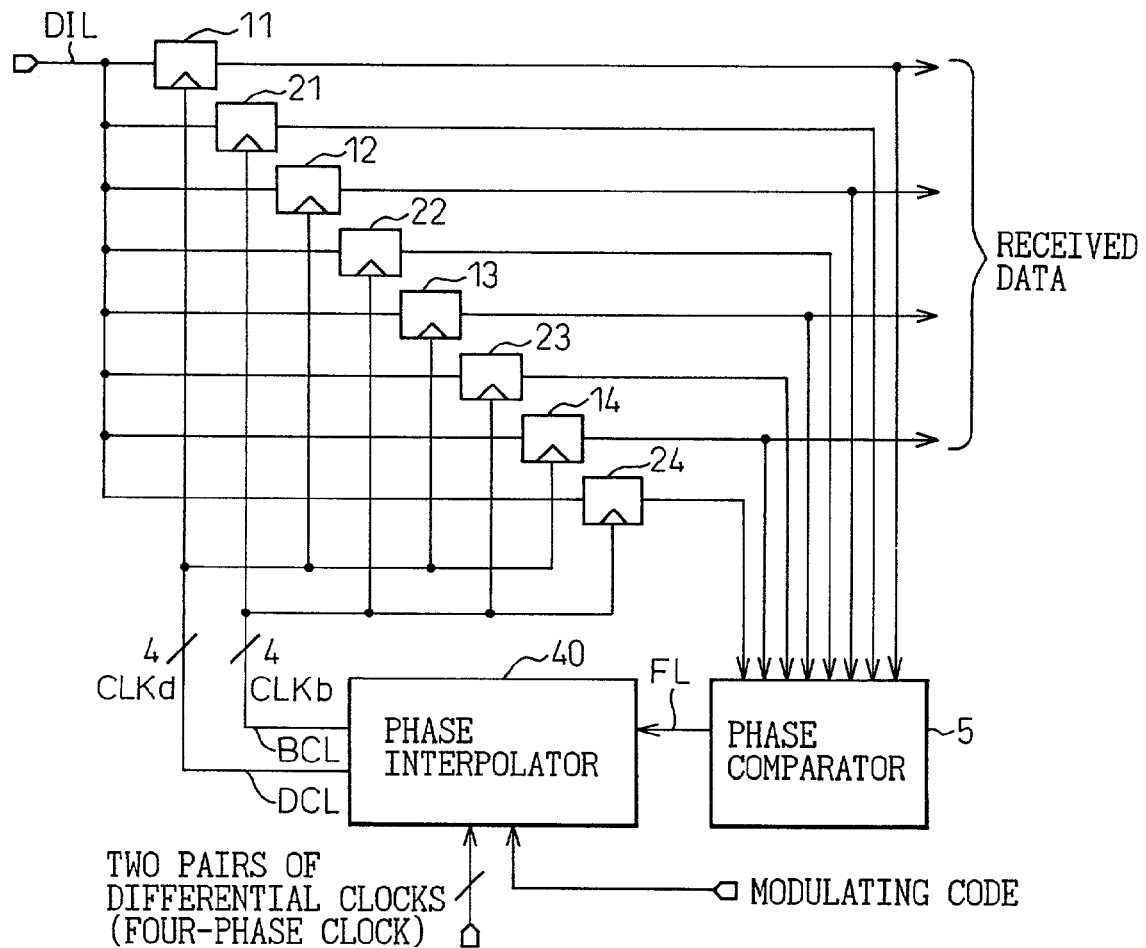
FIG. 11 is a block diagram schematically showing a second embodiment of a receiver circuit according to the present invention.

FIG. 11 is a block diagram schematically showing a second embodiment of a receiver circuit according to the present invention. As is apparent from a comparison between FIG. 11 and the previously given FIG. 1, the circuit block configuration of the second embodiment shown in FIG. 11 is fundamentally the same as that shown in FIG. 1, but the difference lies in the configuration of the phase interpolator 40. That is, in the second embodiment, the phase interpolator 40 includes the function of varying the boundary detection timing in the boundary detection units 21 to 24.

Figure 12:
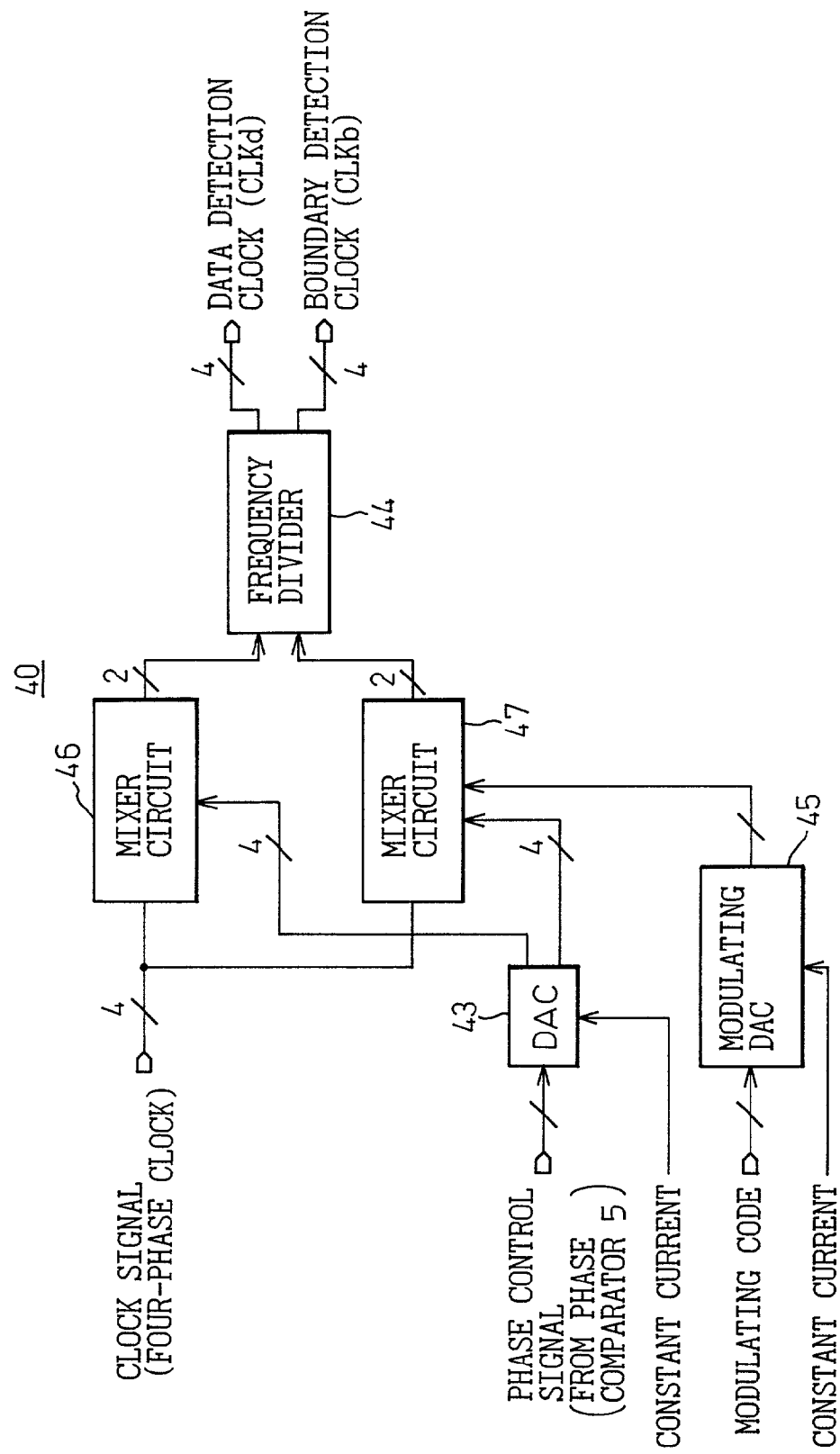
FIG. 12 is a block diagram showing one configuration example of a phase interpolator in the receiver circuit of FIG. 11.

FIG. 12 is a block diagram showing one configuration example of the phase interpolator in the receiver circuit of FIG. 11.

As shown in FIG. 12, the phase interpolator 40 comprises mixer circuits 46 and 47, a digital-to-analog converter (DAC) 43, a frequency divider 44, and a modulating DAC 45. The mixer circuit 46 receives a clock signal (four-phase clock) and an output of the DAC 43, synthesizes, from the four-phase clock, a pair of signals differing in phase by 90 degrees, creates a phase intermediate between them, and generates a clock by applying the phase shift defined by a weight (the output of the DAC 43) to a signal having the intermediate phase. Likewise, the mixer circuit 47 receives the clock signal, an output of the DAC 43, and an output of the modulating DAC 45, synthesizes from the four-phase clock a pair of signals differing in phase by 90 degrees, creates a phase intermediate between them, and generates a clock by applying the phase shift defined by a weight (the output of the DAC 43 and the output of the modulating DAC 45) to a signal having the intermediate phase.

The outputs of the mixer circuits 46 and 47 are supplied to the frequency divider 44, which generates the data detection clock CLKd (CLKd1, CLKd2, CLKd3, and CLKd4) and boundary detection clock CLKb (CLKb1, CLKb2, CLKb3, and CLKb4).

The mixer circuits 46 and 47 each control the phase based on a current value representing the weight; here, the weight for the phase adjustment is created by digitally comparing the phases of the external input clock and internal clock (the data detection clock CLKd and boundary detection clock CLKb) in the phase comparator (5) based on the outputs of the data detection units 11 to 14 and boundary detection units 21 to 24, and is supplied as a phase control signal to the DAC 43.

The DAC 43 receives a constant current as well as the phase control signal (the output of the phase comparator 5), converts the phase adjusting weight into the current, and supplies the current to the mixer circuits 46 and 47. The phases of the clocks CLKd and CLKb are adjusted in the mixer circuit 46 based on the amount of change of the current supplied from the DAC 43 and, in the mixer circuit 47, based on the amount of change of the current supplied from the modulating DAC 45 as well as that supplied from the DAC 43.

In the second embodiment, a digitally expressed external modulating code is applied to the modulating DAC 45 for conversion into a current, and the output current of the modulating DAC 45 is supplied to the mixer circuit 47, thereby providing a skew to the boundary clock signal (boundary detection clock). As the modulating code supplied to the modulating DAC 45 is digitally expressed, a programmable skew can be generated and, with this skew, the boundary detection timing can be effectively shifted forward or backward relative to the original boundary position.

Figure 13:
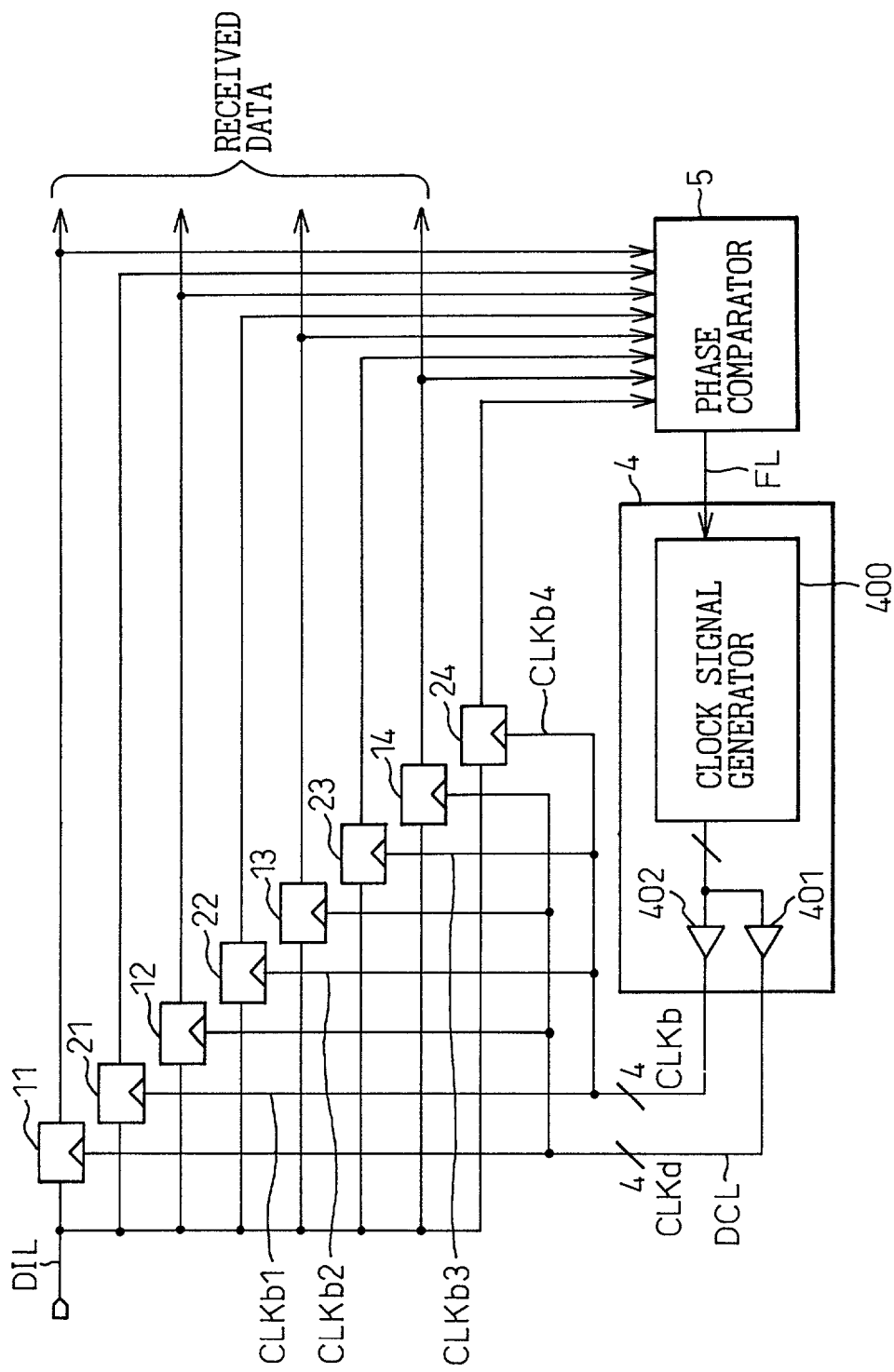
FIG. 13 is a block diagram schematically showing a third embodiment of a receiver circuit according to the present invention.
Figure 14:
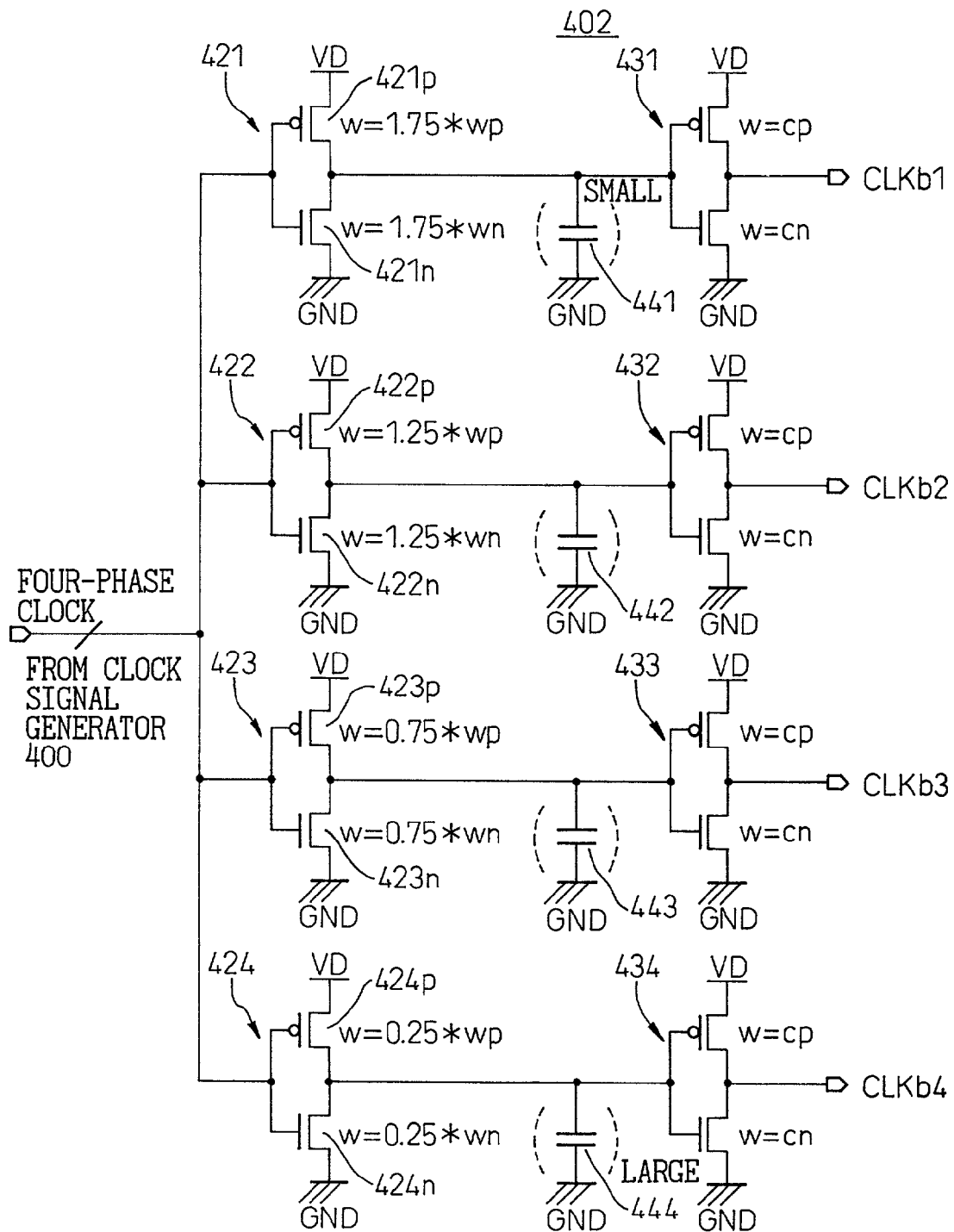
FIG. 14 is a block diagram showing one configuration example of a clock buffer for a boundary detection/discrimination circuit in the receiver circuit of FIG. 13.

FIG. 13 is a block diagram schematically showing a third embodiment of a receiver circuit according to the present invention, and FIG. 14 is a block diagram showing one configuration example of a boundary detection/discrimination clock buffer (boundary detection clock buffer) in the receiver circuit of FIG. 13.

As shown in FIG. 13, the clock signal generating circuit 4 in the receiver circuit (clock recovery circuit) of the third embodiment comprises a clock signal generator 400 and clock buffers 401 and 402. Data detection clocks CLKd (CLKd1 to CLKd4) are supplied to the respective data detection units 11 to 14 via the data detection clock buffer 401, while boundary detection clocks CLKb (CLKb1 to CLKb4) are supplied to the respective boundary detection units 21 to 24 via the boundary detection clock buffer 402.

As shown in FIG. 14, the boundary detection clock buffer 402 receives the four-phase clock from the clock signal generator 400, and generates the boundary detection clocks CLKb (CLKb1 to CLKb4) via two-stage inverters 421/431 to 424/434. In the first-stage inverters 421 to 424, p-channel MOS transistors 421$p$ to 424$p$ and n-channel MOS transistors 421$n$ to 424$n$ are respectively chosen to have different gate widths W.

More specifically, denoting the transistor gate width in the standard clock buffer (data detection clock buffer 401) by wp, the transistors 421$p$ and 421$n$ are each chosen to have a gate width of W=1.75 wp, the transistors 422$p$ and 422$n$ are each chosen to have a gate width of W=1.25 wp, the transistors 423$p$ and 423$n$ are each chosen to have a gate width of W=0.75 wp, and the transistors 424$p$ and 424$n$ are each chosen to have a gate width of W=0.25 wp. By controlling the driving power of each of the first-stage inverters 421 to 424 in this manner, skews of $-3/2\tau$, $-1/2\tau$, $1/2\tau$, and $3/2\tau$, for example, are given to the boundary detection clocks CLKb1, CLKb2, CLKb3, and CLKb4, thereby shifting the respective boundary latch timings from their original timing positions. In FIG. 14, reference character VD designates a power supply, GND is ground, and cp and cn are fixed values.

The boundary detection clocks CLKb1, CLKb2, CLKb3, and CLKb4 provided with different skews as described above are supplied to the respective boundary detection units 21, 22, 23, and 24. In the configuration shown in FIG. 14, prescribed skews are given to the boundary detection clocks CLKb1 to CLKb4 by controlling the transistor sizes of the first-stage inverters in the boundary detection clock buffer 402 that outputs the clocks supplied to the boundary detection/discrimination circuit 2 (boundary detection units 21 to 24); alternatively, the first-stage inverters 421 to 424 may be constructed from transistors of the same size, and capacitors 441 to 444 with capacitance increasing in the order of 441, 442, 443, and 444 may be provided on the output sides of the respective inverters 421 to 424 so that different skews can be given to the respective boundary detection clocks CLKb1 to CLKb4. In another alternative configuration, the transistor sizes of the second-stage inverters 431 to 434 may be adjusted.

Figure 15:
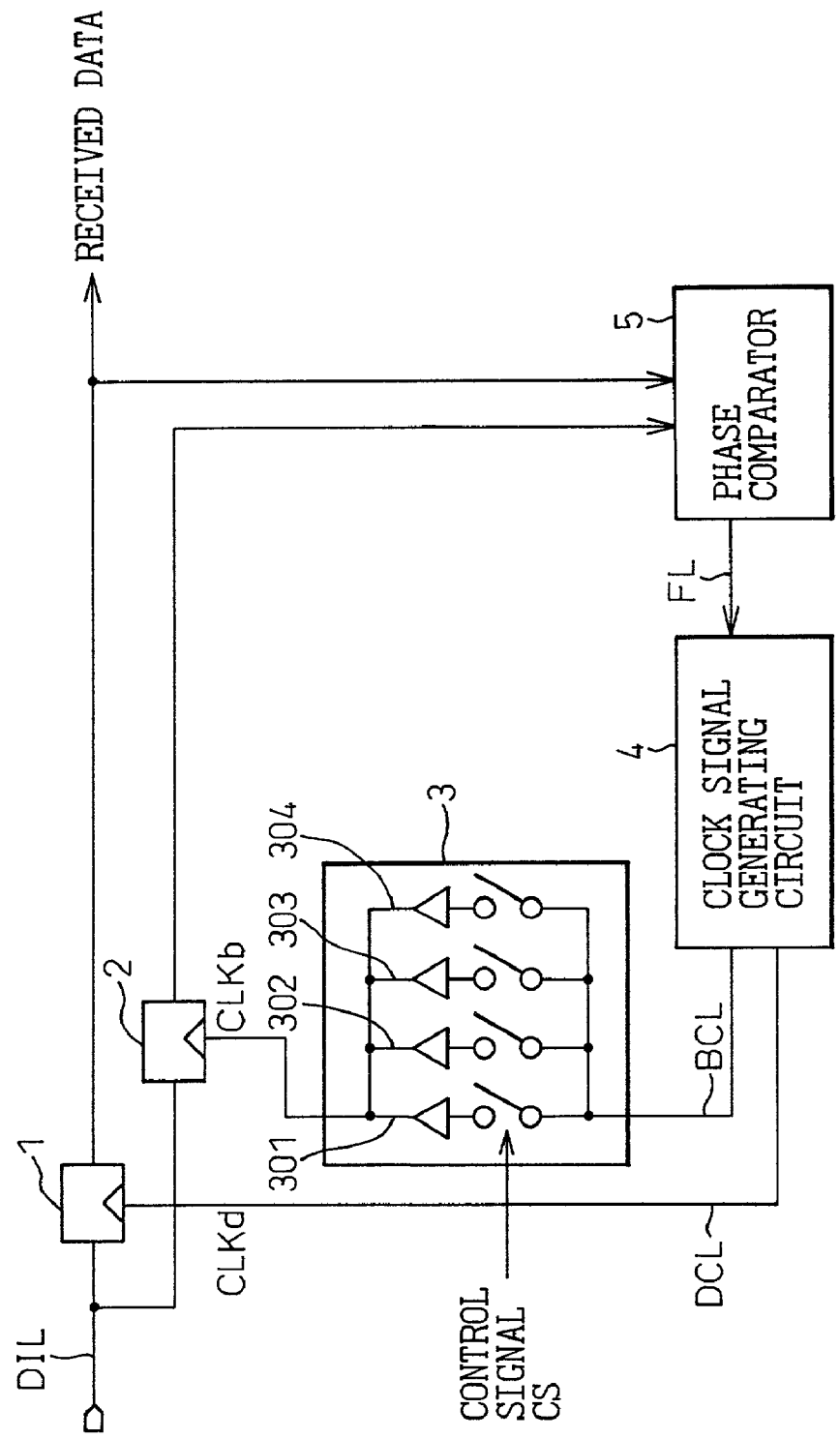
FIG. 15 is a block diagram schematically showing a fourth embodiment of a receiver circuit according to the present invention.

FIG. 15 is a block diagram schematically showing a fourth embodiment of a receiver circuit according to the present invention.

In the receiver circuit (clock recovery circuit) of the fourth embodiment, the boundary skew generating circuit 3 is constructed from a variable delay line (VDL) circuit. That is, in the fourth embodiment, the boundary detection clock CLKb output from the clock signal generating circuit 4 is supplied to the boundary detection circuit 2 via the VDL circuit 3.

As shown in FIG. 15, the VDL circuit 3 is constructed, for example, from a plurality of delay lines 301 to 304 selectively controlled by an external control signal CS, and each of the delay lines 301 to 304 comprises, for example, a buffer, a switch, etc. A suitable skew is given to the boundary detection clock CLKb by controlling the ON/OFF operation of each switch by the external control signal. When providing prescribed skews to the plurality of boundary detection clocks CLKb1 to CLKb4, reproducibility can be enhanced, for example, by cyclically changing the switches of the respective delay lines 301 to 304 and thereby reducing the effects of wiring and other elements and of variations among the characteristics of the buffers.

As described above, in the present invention, the boundary detection timing is effectively shifted forward or backward relative to the original boundary position; it will, however, be noted that the specific configuration for achieving this is not limited to any one of the above embodiments, but various other configurations are also possible.

According to the embodiments of the receiver circuit (clock recovery circuit) of the present invention, since the linearity of the phase comparator is improved as described above, the amplitude of the limit cycle signal can be reduced, and the predictability of the circuit characteristics can be improved by reducing the jitter dependence and signal level dependence of the feedback loop characteristic.

As described in detail above, according to the first mode (first to fourth embodiments) of the present invention, there is provided a clock recovery circuit and receiver circuit that achieves high-speed signal transmission by reducing the amplitude of the limit cycle signal and also reducing the jitter dependence and signal level dependence of the feedback loop characteristic (to facilitate prediction of the circuit characteristics).

Next, a second mode of the present invention will be described in detail below. Though the description is somewhat lengthy, a prior art clock recovery circuit and receiver circuit corresponding to the second mode of the invention and their associated problems will be described with reference to accompanying drawings.

Figure 16:
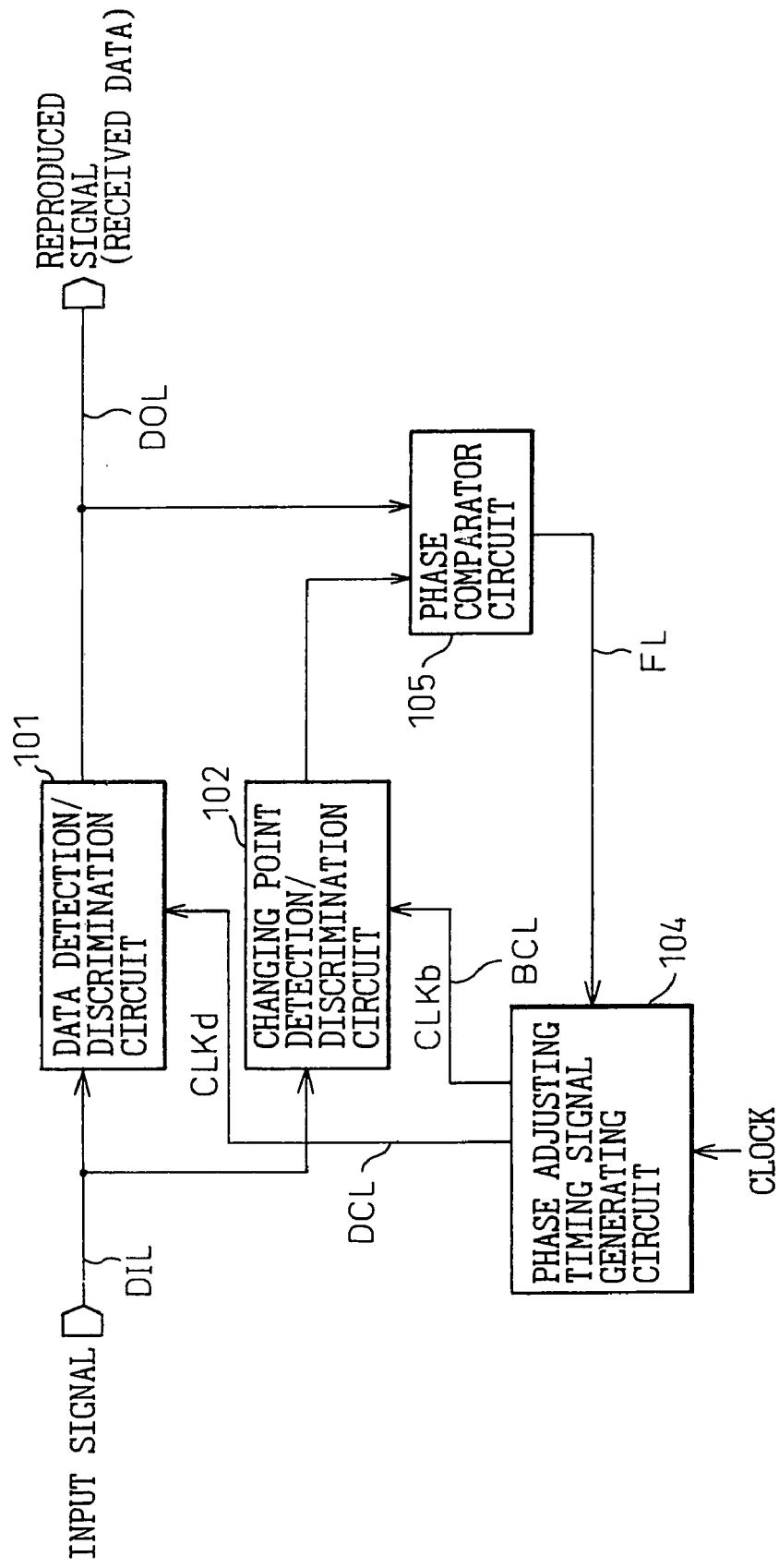
FIG. 16 is a block diagram schematically illustrating one example of a receiver circuit, including a clock recovery circuit, according to the prior art.

FIG. 16 is a block diagram schematically illustrating one example of the prior art receiver circuit, including the clock recovery circuit. In FIG. 16, reference numeral 101 is a data detection/discrimination circuit, 102 is a changing point detection/discrimination circuit, 104 is a phase adjusting timing signal generating circuit (phase interpolator), and 105 is a phase comparator circuit. Further, reference character DIL is a data input line, DOL is a data output line, DCL is a data detection clock line, BCL is a changing point detection clock line, and FL is a feedback line.

As shown in FIG. 16, in the prior art receiver circuit (clock recovery circuit), a clock is supplied to the phase adjusting timing signal generating circuit 104 which integrates and compares the weighted sum of the input clocks and thereby generates clocks (CLKd and CLKb) of the phases corresponding to the weight value, and supplies the data detection clock CLKd to the data detection/discrimination circuit 101 and the changing point detection clock CLKb to the changing point detection/discrimination circuit 102.

The phase comparator circuit 105 compares the outputs of the data detection/discrimination circuit 101 and changing point detection/discrimination circuit 102, and feeds back the feedback signal (control signal) to the phase adjusting timing signal generating circuit 104 via the feedback line FL.

Here, the term "clock recovery circuit" is used by focusing attention on the fact that the data detection clock is recovered from the input signal, while the term "receiver circuit" is used by focusing attention on the fact that the data detection/discrimination circuit, using the recovered clock, detects and discriminates the data carried in the input signal, and outputs the data as the received data.

Figure 17:
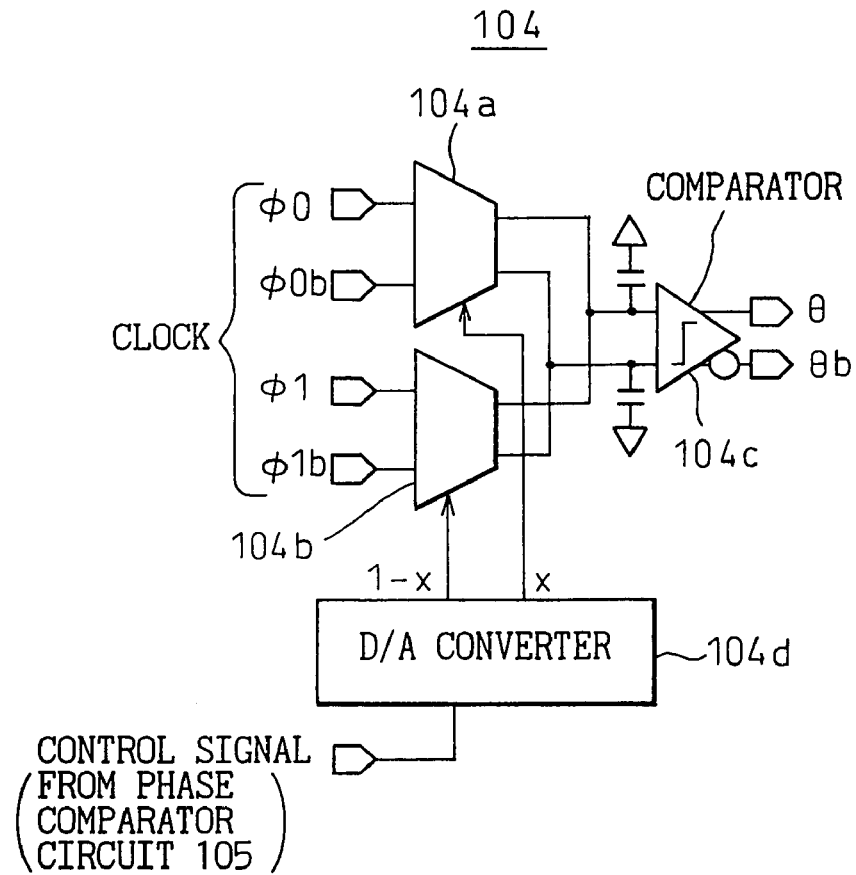
FIG. 17 is a block circuit diagram showing one example of a phase adjusting timing signal generating circuit in the receiver circuit of FIG. 16.
Figure 18:
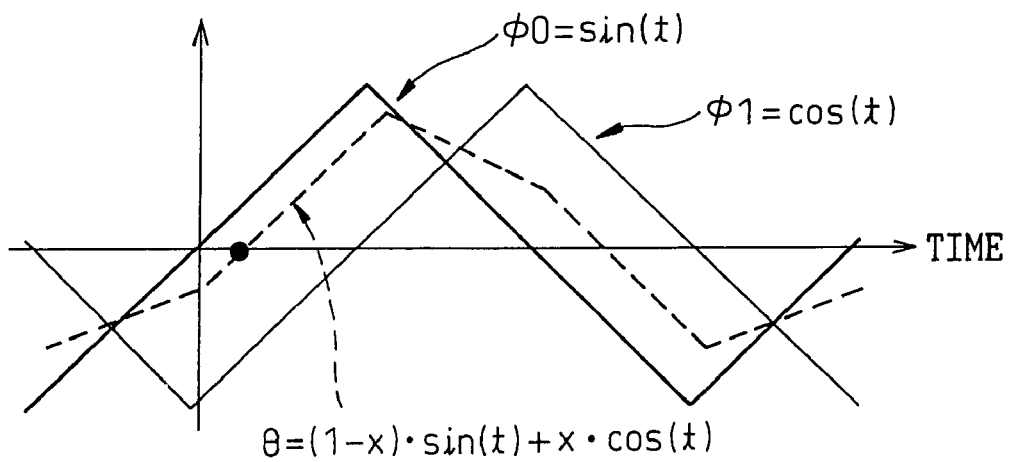
FIG. 18 is a waveform diagram for explaining the operation of the phase adjusting timing signal generating circuit of FIG. 17.

FIG. 17 is a block circuit diagram showing one example of the phase adjusting timing signal generating circuit 104 in the receiver circuit of FIG. 16, and FIG. 18 is a waveform diagram for explaining the operation of the phase adjusting timing signal generating circuit of FIG. 17. In FIG. 17, reference numerals 104a and 104b are mixer circuits (phase mixers), 104c is a comparator, and 104d is a digital-to-analog converter (D/A converter).

The mixer circuits 104a and 104b each receive clocks $\phi 0$ and $\phi 0b$ or $\phi 1$ and $\phi 1b$ and an output of the D/A converter 104d, apply a weight (the output of the D/A converter 104d) to each clock, and thereby output a clock $\theta$ ($\theta b$) having a phase intermediate between the respective clocks through the comparator 104c. Here, the weight is given by the control signal output from the phase comparator circuit 105.

In a specific example, if $\phi 0 = \sin(t)$ and $\phi 1 = \cos(t)$, as shown in FIG. 18, $\phi 0$ is weighted with $(1-x)$ and $\phi 1$ with $(x)$, and the combined signal $\theta$ is then given as $\theta = (1-x) \cdot \sin(t) + x \cdot \cos(t)$.

Figure 19:
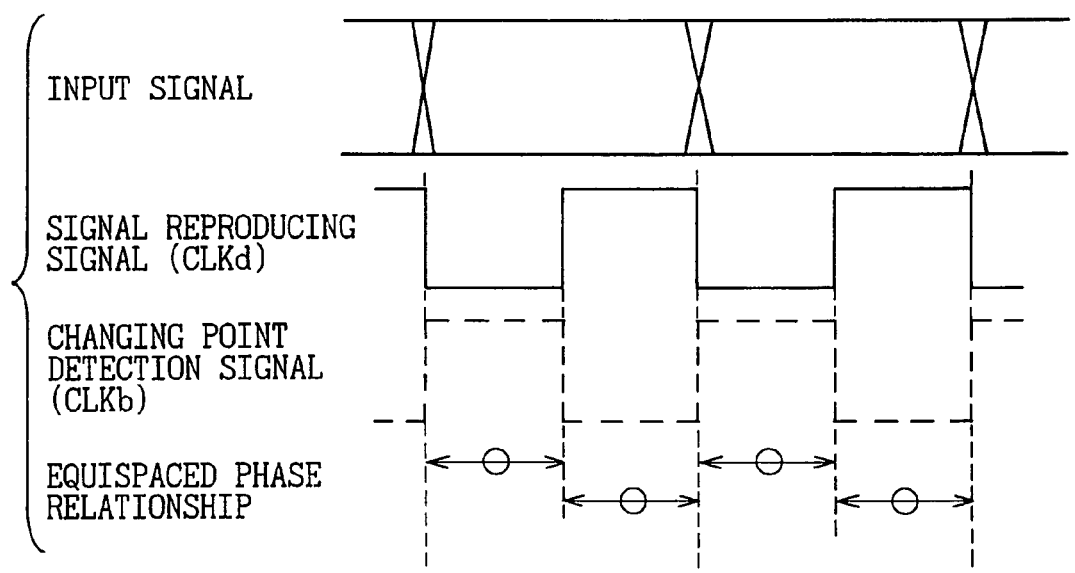
FIG. 19 is a diagram showing the timing relationship between signals in the receiver circuit of FIG. 16.

FIG. 19 is a diagram showing the timing relationship between the signals in the receiver circuit of FIG. 16.

The phase adjusting timing signal generating circuit 104 described above generates a signal reproducing signal (data detection clock CLKd) and a changing point detection signal (changing point detection clock CLKb), each as a clock having a pulse width one half the pulse width of one bit of the input signal, and supplies them to the data detection/discrimination circuit 101 and the changing point detection/discrimination circuit 102, respectively. Here, the phase relationship between the data detection clock CLKd and the changing point detection clock CLKb is such that their rising edges are equally spaced apart from each other, that is, when the rise timing of the changing point detection clock CLKb is at the changing point, the rise timing of the data detection clock CLKd is located at the phase center of the input signal (data eye).

Figure 20:
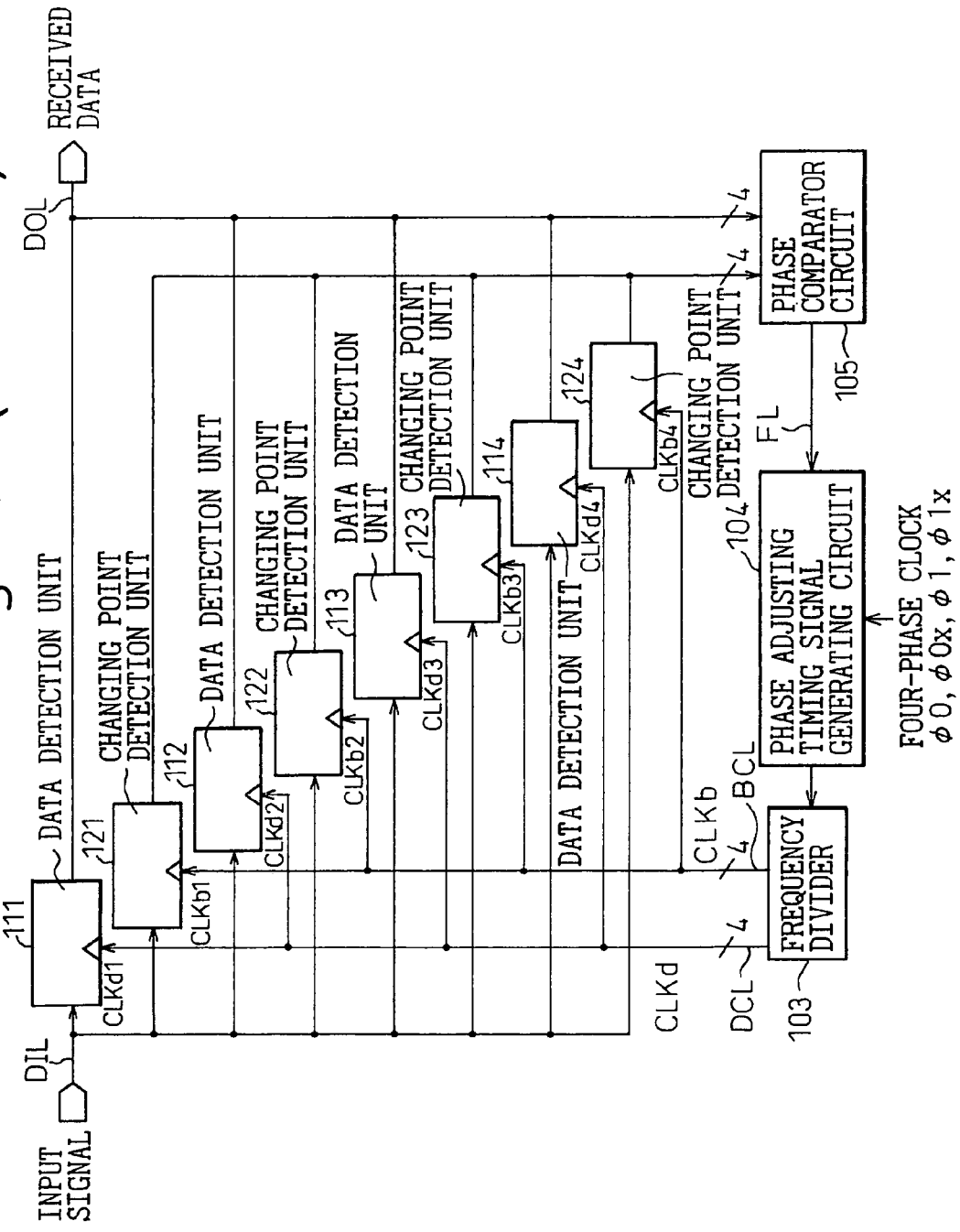
FIG. 20 is a block diagram schematically illustrating another example of the prior art receiver circuit, including the clock recovery circuit.

FIG. 20 is a block diagram schematically illustrating another example of the prior art receiver circuit, including the clock recovery circuit, wherein the circuit is configured as a 4-way×2 type interleaving circuit. In FIG. 20, reference numerals 111 to 114 are data detection units, 121 to 124 are changing point detection units, 103 is a frequency divider, 104 is a phase adjusting timing signal generating circuit, and 105 is a phase comparator circuit.

As shown in FIG. 20, in the prior art receiver circuit, two pairs of differential clock signals ($\phi 0$, $\phi 0x$; $\phi 1$, $\phi 1x$) are supplied as a four-phase input signal (four-phase clock) to the phase adjusting timing signal generating circuit 104 which integrates and compares the weighted sum of the input signals and generates, through the frequency divider 103, clocks (CLKd and CLKb) of the phases corresponding to the weight value.

The clock CLKd consists of four data detection unit control signals CLKd1, CLKd2, CLKd3, and CLKd4, each with a phase difference of 90 degrees, for example, and these control signals are supplied to the respective data detection units (data detection/discrimination circuits) 111 to 114.

On the other hand, the clock CLKb consists of four changing point detection unit control signals CLKb1, CLKb2, CLKb3, and CLKb4, each with a phase difference of 90 degrees, for example, and these control signals are supplied to the respective changing point detection units (changing point detection/discrimination circuits) 121 to 124. The data detection unit control signals CLKd1, CLKd2, CLKd3, and CLKd4 have a phase difference of 45 degrees relative to the respective changing point detection unit control signals CLKb1, CLKb2, CLKb3, and CLKb4.

Accordingly, when data is supplied on the data input line DIL at a rate of 2.5 G [bps], for example, the data detection units 111 to 114 and changing point detection units 121 to 124 perform interleaving by being driven with a 625-MHz clock.

The data detection units 111 to 114 are each driven, for example, with a 625-MHz clock (data detection unit control signal CLKd1, CLKd2, CLKd3, or CLKd4), detect and discriminate the data carried in the input signal supplied on the data input line DIL, and output the data as received data (reproduced signal). The outputs of the data detection units 111 to 114 are also supplied to the phase comparator circuit 105.

Likewise, the changing point detection units 121 to 124 are each driven, for example, with a 625-MHz clock (changing point detection unit control signal CLKb1, CLKb2, CLKb3, or CLKb4), detect and discriminate changing points appearing in the input signal supplied on the data input line DIL, and supply the result to the phase comparator circuit 105.

The phase comparator circuit 105 compares the outputs of the data detection units 111 to 114 and changing point detection units 121 to 124, and supplies (feeds back) a feedback signal to the phase adjusting timing signal generating circuit 104 via the feedback line FL.

Figure 21:
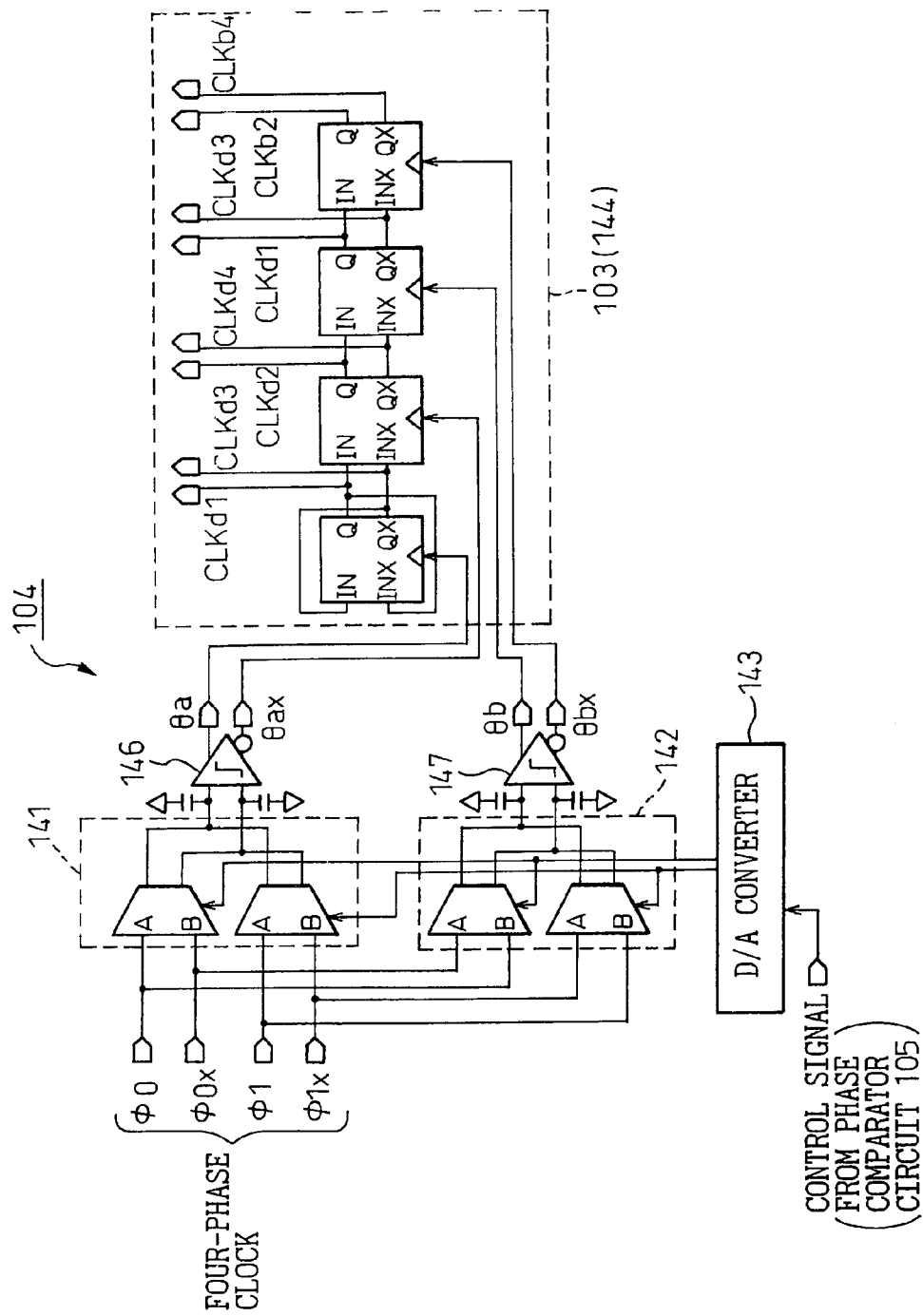
FIG. 21 is a block circuit diagram showing one example of a phase adjusting timing signal generating circuit in the receiver circuit of FIG. 20.
Figure 22:
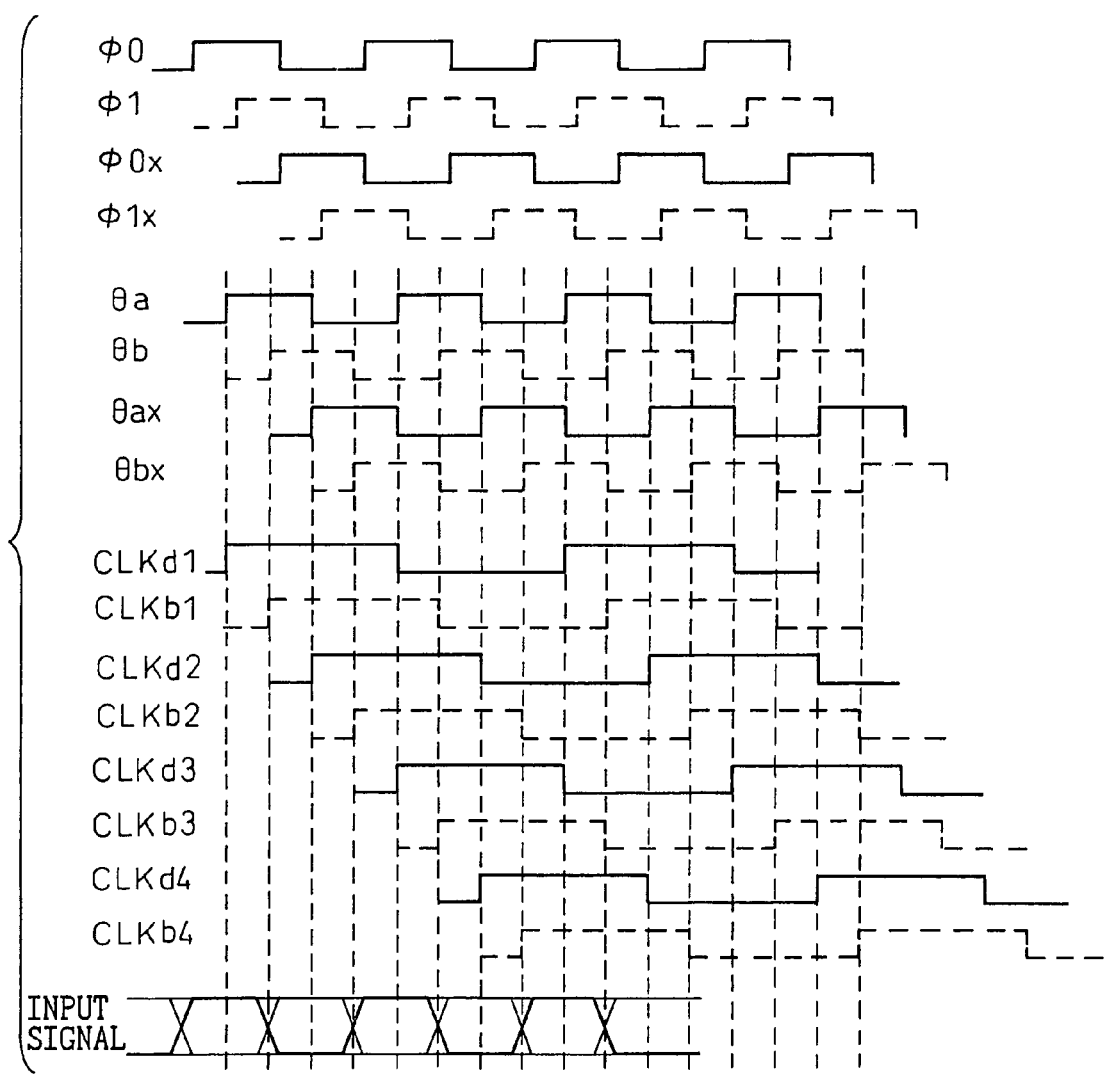
FIG. 22 is a diagram showing signal timings in the phase adjusting timing signal generating circuit of FIG. 21.

FIG. 21 is a block circuit diagram showing one example of the phase adjusting timing signal generating circuit in the receiver circuit of FIG. 20, and FIG. 22 is a diagram showing signal timings in the phase adjusting timing signal generating circuit of FIG. 21.

As shown in FIGS. 21 and 22, the phase adjusting timing signal generating circuit 104 comprises mixer circuits (phase mixers) 141 and 142, a digital-to-analog converter (D/A converter) 143, and comparators 146 and 147. The mixer circuits 141 and 142 each receive clock signals (four-phase clock) φ0, φ0x; φ1, φ1x and an output of the D/A converter 143, apply a weight (the output of the D/A converter 143) to each clock signal and thereby generate clocks θa, θax; θb, θbx each having a phase intermediate between the respective clocks, and generate, through the frequency divider 103, data detection clocks CLKd (CLKd1, CLKd2, CLKd3, CLKd4) and changing point detection clocks CLKb (CLKb1, CLKb2, CLKb3, CLKb4).

The mixer circuits 141 and 142 each control the phase based on a current value representing the weight; here, the weight for the phase adjustment is created by the phase comparator circuit (105) digitally comparing the phases of the clocks obtained from the outputs of the data detection units 111 to 114 and changing point detection units 121 to 124, and is supplied as a phase control signal to the D/A converter 143.

The D/A converter 143 receives a constant current as well as the phase control signal (the output of the phase comparator circuit 105), converts the phase adjusting weight into the current, and supplies the current to the mixer circuits 141 and 142. The phases of the clocks CLKd and CLKb are adjusted based on the amount of change of the current.

Figure 23:
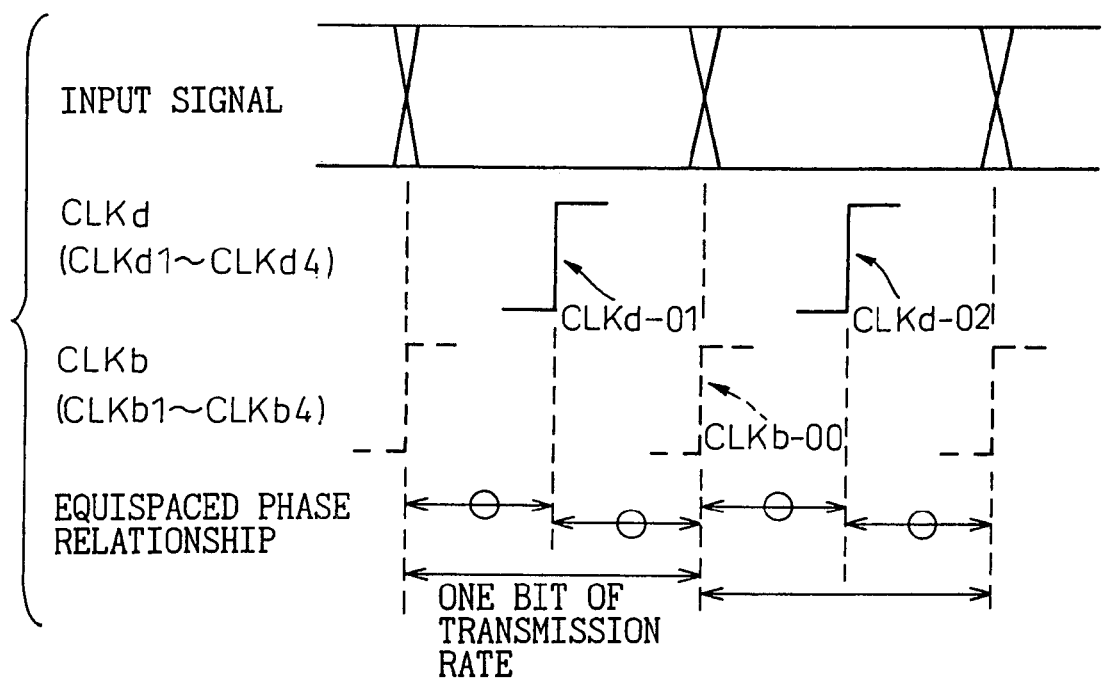
FIG. 23 is a diagram showing signal timings in the prior art receiver circuit.

FIG. 23 is a diagram showing signal timings in the prior art receiver circuit and, more specifically, the input signal and the phase relationship between the data detection clock CLKd supplied to the data detection/discrimination circuit 101 and the changing point detection clock CLKb supplied to the changing point detection/discrimination circuit 102 in FIG. 16 or the phase relationship between the data detection unit control signals CLKd1 to CLKd4 supplied to the data detection units 111 to 114 and the changing point detection unit control signals CLKb1 to CLKb4 supplied to the changing point detection units 121 to 124 in FIG. 20; as shown here, the phases of the respective clocks or signals are equally spaced apart from each other. More specifically, the data detection clock CLKd (CLKd1 to CLKd4) and the changing point detection clock CLKb (CLKb1 to CLKb4) have a equispaced phase relationship relative to each other with a phase difference equivalent to one half of one bit of input signal transmission rate. Accordingly, when the changing point detection clock CLKb is at the changing point of the input signal, the data detection clock CLKd is located at the phase center of the input signal.

In FIG. 23, reference character CLKd-01 indicates one rise timing of a particular data detection clock CLKd (for example, the data detection unit control signal CLKd1) supplied to the data detection/discrimination circuit 101 (the data detection unit 111), and CLKd-02 indicates the next rise timing immediately subsequent to the rise timing CLKd-01 of that particular data detection clock CLKd (the data detection unit control signal CLKd1). Further, reference character CLKb-01 indicates the rise timing of the changing point detection clock CLKb (the changing point detection unit control signal CLKb1) supplied to the changing point detection/discrimination circuit 102 (the changing point detection unit 121), the rise timing occurring between the rise timings CLKd-01 and CLKd-02 of the data detection clock CLKd (the data detection unit control signal CLKd1).

Figure 24:
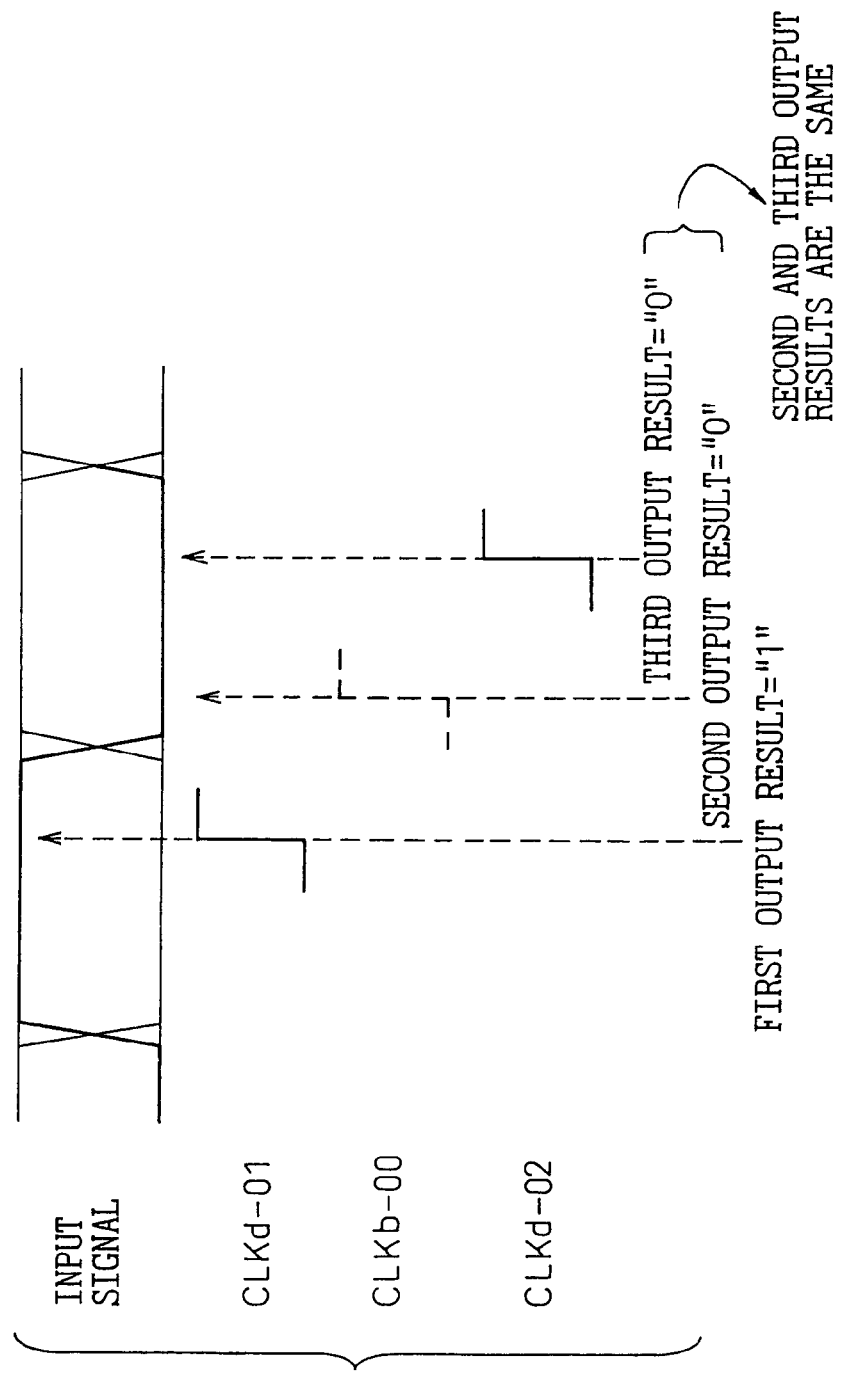
FIG. 24 is diagram (part 1) for explaining the timing of a changing point detection signal relative to an input signal in the receiver circuit.
Figure 25:
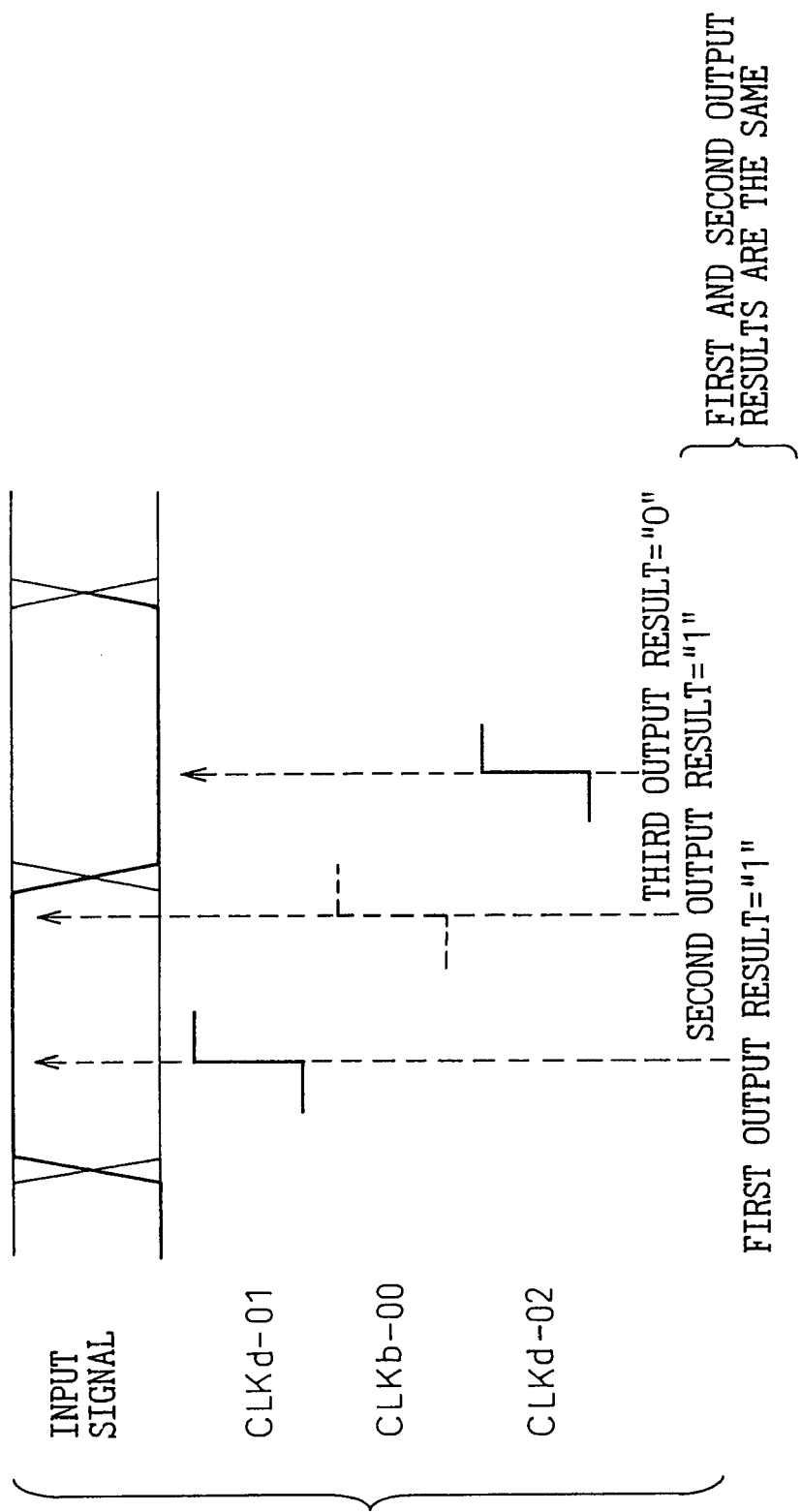
FIG. 25 is diagram (part 2) for explaining the timing of the changing point detection signal relative to the input signal in the receiver circuit.

FIGS. 24 and 25 are diagrams for explaining the timing of the changing point detection signal relative to the input signal in the receiver circuit, and more specifically, the relationships of the rise timings CLKd-01 and CLKd-02 of the data detection clock CLKd and the rise timing CLKb-01 of the changing point detection clock CLKb relative to the input signal. The illustrated example shows the case where the input signal alternates between a "1" and a "0".

As shown in FIG. 24, when the output (first output result) of the data detection/discrimination circuit 101 by the rise timing CLKd-01 of the data detection clock CLKd is a "1", and the output (second output result) of the changing point detection/discrimination circuit 102 by the rise timing CLKb-01 of the changing point detection clock CLKb and the output (third output result) of the data detection/discrimination circuit 101 by the rise timing CLKd-02 of the data detection clock CLKd are both "0", then it is seen that the phase of the timing signal is delayed with respect to the input signal. When the first output result is a "0", and the second and third output results are both "1", the situation is the same, that is, the phase of the timing signal is delayed with respect to the input signal.

Conversely, as shown in FIG. 25, when the output (first output result) of the data detection/discrimination circuit 101 at the rise timing CLKd-01 of the data detection clock CLKd and the output (second output result) of the changing point detection/discrimination circuit 102 at the rise timing CLKb-01 of the changing point detection clock CLKb are both "1", and the output (third output result) of the data detection/discrimination circuit 101 by the rise timing CLKd-02 of the data detection clock CLKd is a "0", then it is seen that the phase of the timing signal is advanced with respect to the input signal. When the first and second output results are both "0", and the third output result is a "1", the situation is the same, that is, the phase of the timing signal is advanced with respect to the input signal.

In this way, the phase comparator circuit 105 can determine whether the phase of the timing signal is advanced or delayed with respect to the input signal by referring to the first to third output results, and feeds back the resulting control signal to the phase adjusting timing signal generating circuit 104 via the feedback line FL to adjust the phase of the timing signal with respect to the input signal. More specifically, when it is determined from the first to third output results that the phase of the timing signal is advanced with respect to the input signal, the phase comparator circuit 105 feeds back a control signal for delaying the phase of the timing signal (the output signal of the phase adjusting timing signal generating circuit 104) to the phase adjusting timing signal generating circuit 104; conversely, when it is determined that the phase of the timing signal is delayed with respect to the input signal, a control signal for advancing the phase of the timing signal is fed back to the phase adjusting timing signal generating circuit 104.

By repeating the above operation, the timing of the changing point detection clock CLKb (changing point detection unit control signals CLKb1 to CLKb4) is made to synchronize in phase to the change point of the input signal.

Figure 26:
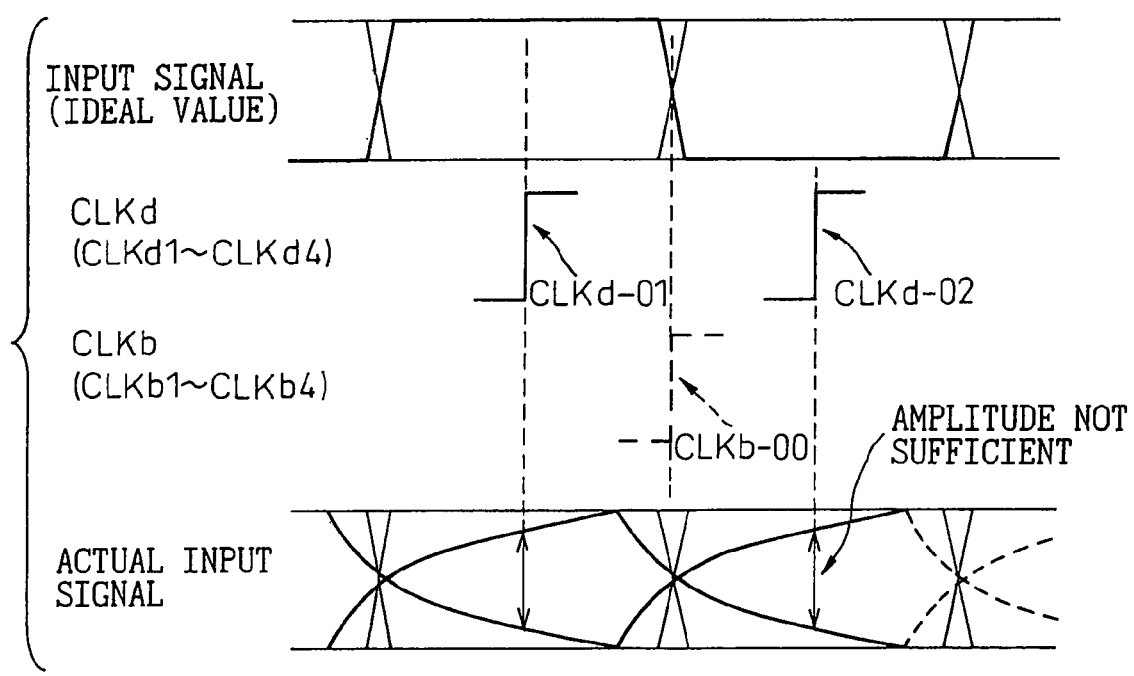
FIG. 26 is a diagram for explaining the problem associated with the prior art receiver circuit.

FIG. 26 is a diagram for explaining the problem of the prior art receiver circuit by adding an actual input signal waveform to the waveform diagram of FIG. 23.

When the timing of the changing point detection clock CLKb (changing point detection unit control signals CLKb1 to CLKb4) is made to synchronize in phase to the change point of the input signal by the feedback control explained with reference to FIGS. 24 and 25, the waveform of the actual input signal does not become an ideal waveform but is distorted, as shown in FIG. 26, due to the characteristic (limited frequency band) of the signal transmission line and other factors such as parasitic capacitance. As a result, if the rise timing of the data detection clock CLKd is at the phase center of the input signal (the center of the data eye), it is not possible to detect data with a sufficient amplitude.

This is because the maximum amplitude position of the input signal is displaced from the center of the data eye in the lagging direction, for example, because of the limited frequency band of the signal transmission line; as a result, if the rise timing of the data detection clock CLKd is at the center of the data eye (the phase center of the input signal), the data detection/discrimination circuit 101 (the data detection units 111 to 114) detects and discriminates the signal at a position where a sufficient amplitude cannot be obtained, and this has lead to the problem of signal reproduction error.

In view of the above-described problem of the prior art, it is an object of the present invention to provide a clock recovery circuit and receiver circuit that can achieve signal reproduction with enhanced accuracy by adjusting the phase of the data detection clock.

Figure 27:
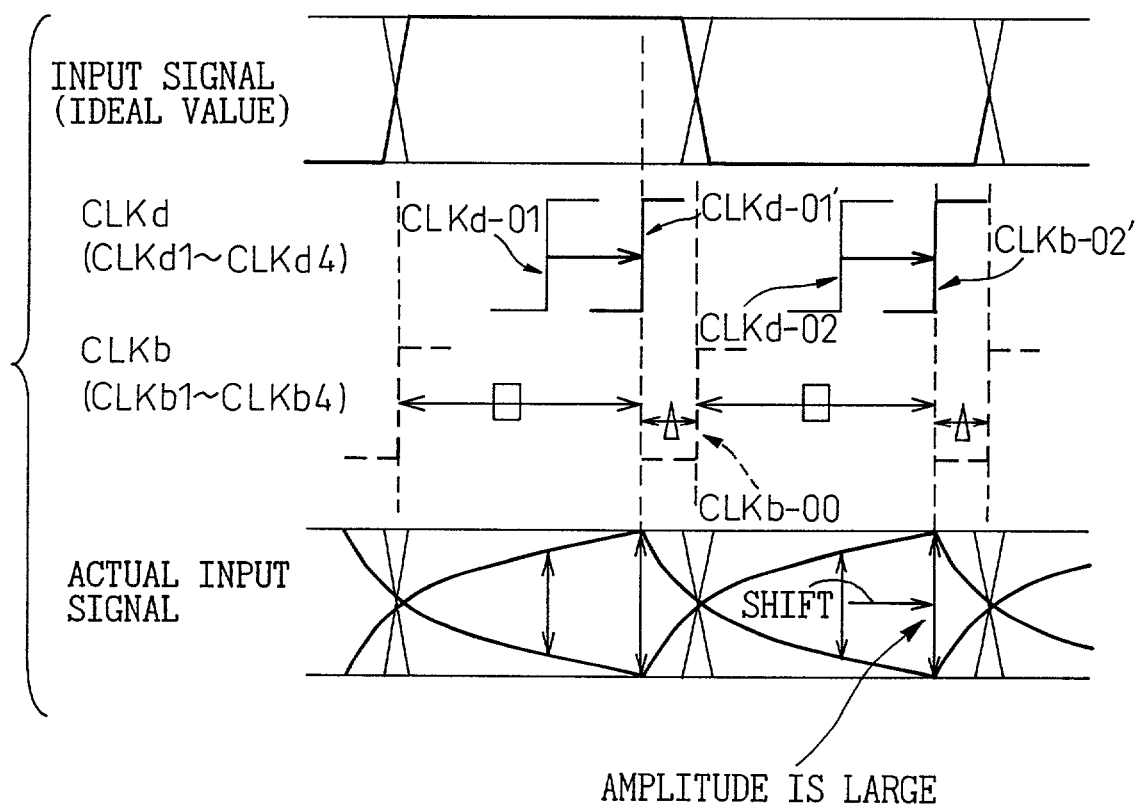
FIG. 27 is a diagram for explaining the operation of a second mode of a receiver circuit according to the present invention.

FIG. 27 is a diagram for explaining the operation of the second mode of the receiver circuit according to the present invention.

As can be seen from a comparison between FIG. 26 illustrating the prior art and FIG. 27 illustrating the present invention, according to the present invention the timing of the data detection clock CLKd is shifted from the phase center of the input signal (the center of the data eye); for example, when the maximum amplitude position of the input signal is displaced from the center of the data eye in the lagging direction because of the limited frequency band of the signal transmission line, the timing of the data detection clock CLKd is shifted in the lagging direction so that after the feedback loop is stabilized, data can be detected at a position where a sufficient amplitude can be obtained.

That is, according to the receiver circuit (clock recovery circuit) of the present invention, signal reproduction accuracy is enhanced by shifting (adjusting) the timing of the data detection clock CLKd from the phase center of the input signal (the center of the data eye) to the phase (position) where a sufficient and effective signal amplitude can be obtained.

Figure 28:
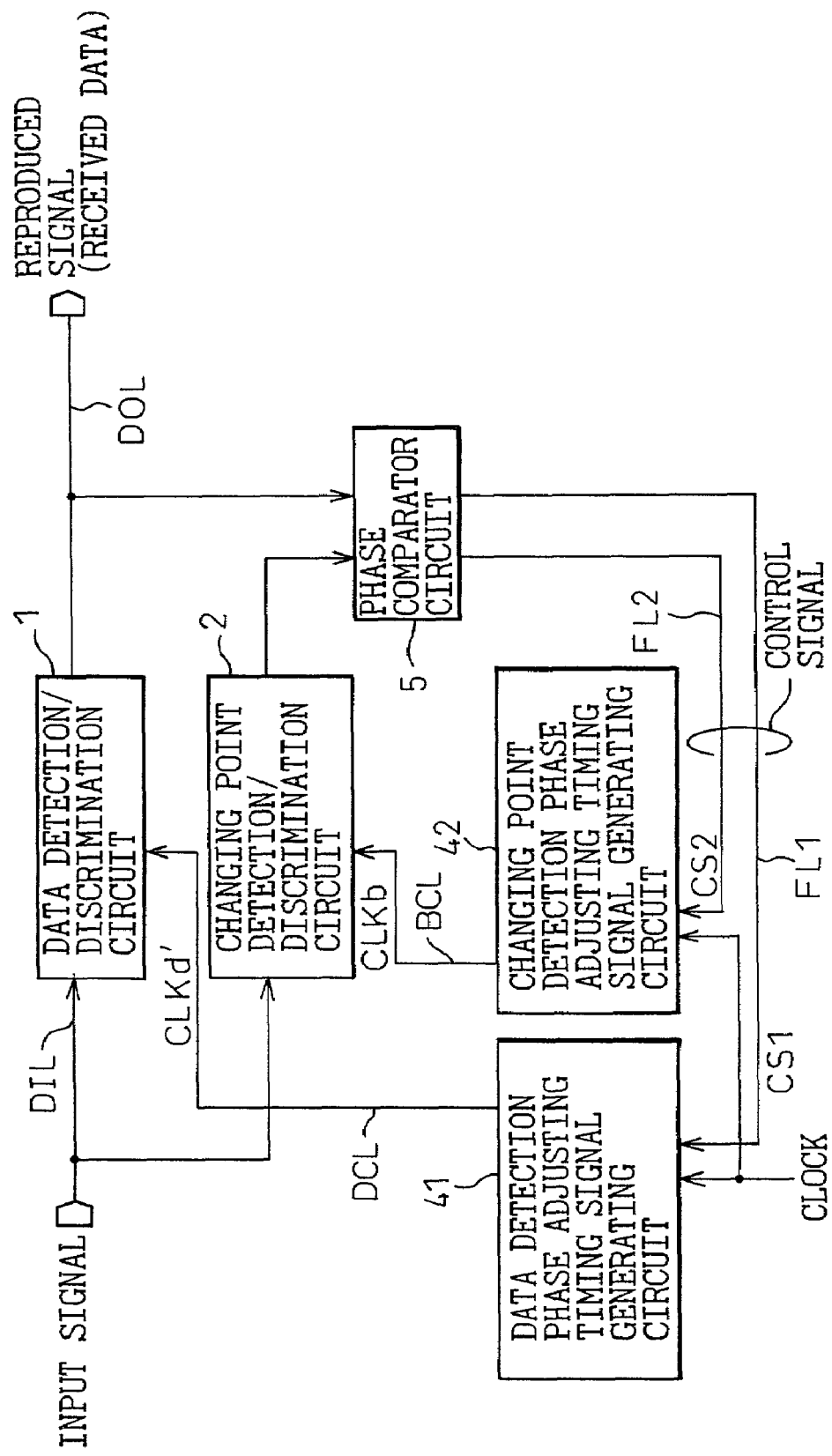
FIG. 28 is a block diagram showing a fifth embodiment of a receiver circuit (clock recovery circuit) according to the present invention.

FIG. 28 is a block diagram showing a fifth embodiment of a receiver circuit (clock recovery circuit) according to the present invention. In FIG. 28, reference numeral 1 is a data detection/discrimination circuit, 2 is a changing point detection/discrimination circuit, 41 is a data detection phase adjusting timing signal generating circuit (data detection phase interpolator), 42 is a changing point detection phase adjusting timing signal generating circuit (changing point detection phase interpolator), and 5 is a phase comparator circuit. Further, reference character DIL is a data input line, DOL is a data output line, DCL is a data detection clock line, BCL is a changing point detection clock line, and FL1 and FL2 are feedback lines. The data detection phase adjusting timing signal generating circuit 41 and the changing point detection phase adjusting timing signal generating circuit 42 together constitute a clock signal generating circuit (phase adjusting timing signal generating means).

As can be seen from a comparison between FIG. 16 illustrating the prior art and FIG. 28 illustrating the fifth embodiment, the receiver circuit (clock recovery circuit) of the fifth embodiment differs from the prior art in that the phase adjusting timing signal generating circuit 104 in FIG. 16 is divided into the data detection phase adjusting timing signal generating circuit 41 and the changing point detection phase adjusting timing signal generating circuit 42, and in that the phase comparator circuit 5 supplies control signals CS1 and CS2 separately to the respective circuits via the respective feedback lines FL1 and FL2. Here, the control signal CS1 supplied to the data detection phase adjusting timing signal generating circuit 41 and the control signal CS2 supplied to the changing point detection phase adjusting timing signal generating circuit 42 are controlled separately from each other.

That is, the changing point detection phase adjusting timing signal generating circuit 42 is feedback-controlled by the control signal CS2 supplied from the phase comparator circuit 5 via the feedback clock line FL2 in such a manner that the changing point detection clock CLKb output from it is phase synchronized to the change point of the input signal, as in the case of the circuit shown in FIG. 16. On the other hand, the data detection phase adjusting timing signal generating circuit 41 is feedback-controlled by the control signal CS1 supplied from the phase comparator circuit 5 via the feedback clock line FL1 in such a manner that the data detection clock CLKd' output from it occurs at optimum timing appropriate to the actual input signal waveform (for example, at a position delayed from the center of the data eye when the maximum amplitude position of the input signal is delayed with respect to the center of the data eye).

The basic configuration of the receiver circuit (clock recovery circuit) is the same as that of the prior art circuit shown in FIG. 16; that is, clocks (for example, four-phase clocks φ0, φ0b; φ1, φ1b) are supplied to the data detection phase adjusting timing signal generating circuit 41 and the changing point detection phase adjusting timing signal generating circuit 42, the weighted sum of the input clocks is integrated and compared to generate clocks (CLKd' and CLKb) of the phases corresponding to the weight value, and the data detection clock CLKd' is supplied to the data detection/discrimination circuit 1 and the changing point detection clock CLKb to the changing point detection/discrimination circuit 2.

The phase comparator circuit 5 compares the outputs of the data detection/discrimination circuit 1 and changing point detection/discrimination circuit 2, and feeds back the feedback signals (control signals) to the data detection phase adjusting timing signal generating circuit 41 and the changing point detection phase adjusting timing signal generating circuit 42 via the feedback lines FL1 and FL2, respectively.

In this way, when the control signal for the data detection phase adjusting timing signal generating circuit 41 that generates the data detection clock CLKd' is shifted by a prescribed rate with respect to the control signal for the changing point detection phase adjusting timing signal generating circuit 42 that generates the changing point detection clock CLKb, the changing point detection clock CLKb and the data detection clock CLKd' can be made to have a phase relationship other than an equispaced phase relationship, and even when the input signal has a frequency band constraint, for example, the signal can be reproduced at the phase (position) where the amplitude of the input signal is large.

Furthermore, when the frequency band constraint of the input signal is small, for example, because the signal transmission line is short, the changing point detection clock CLKb and the data detection clock CLKd' can be made to have an equispaced phase relationship, as in the prior art, by supplying the same control signal to the data detection phase adjusting timing signal generating circuit 41 and the changing point detection phase adjusting timing signal generating circuit 42.

Figure 29:
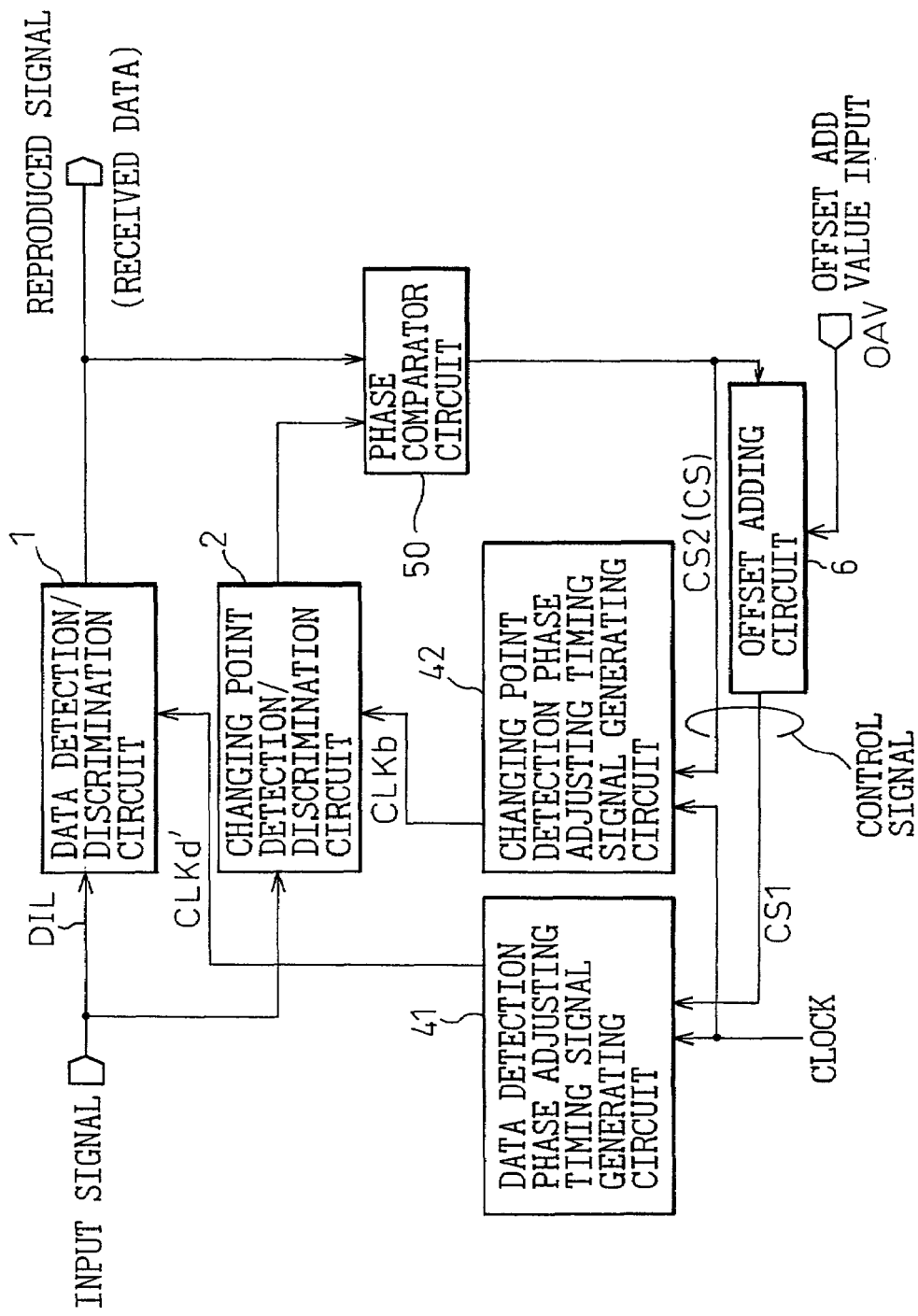
FIG. 29 is a block diagram showing a sixth embodiment of a receiver circuit according to the present invention.
Figure 30:
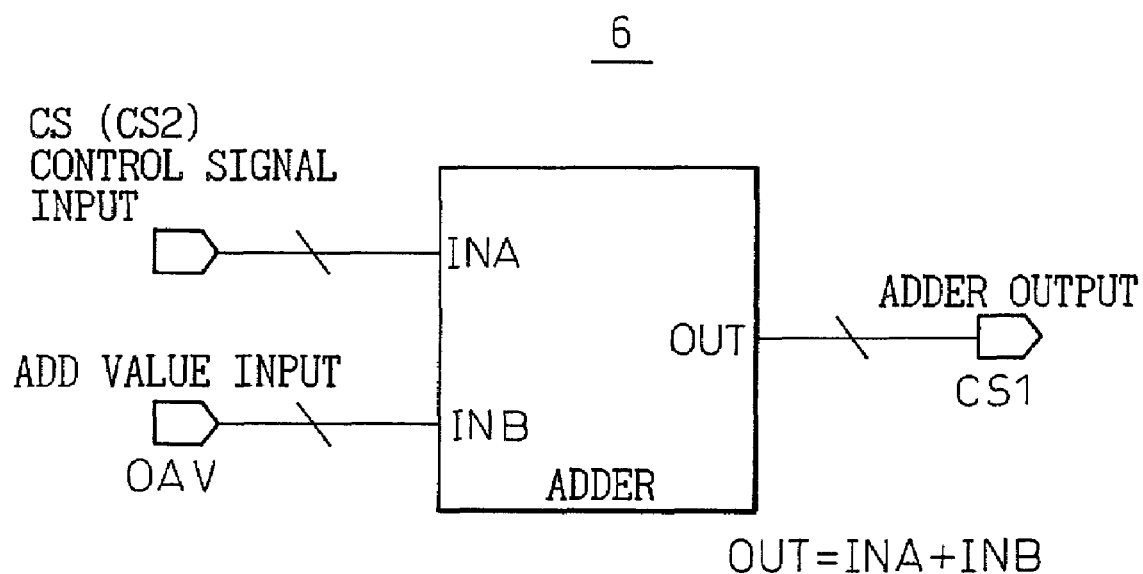
FIG. 30 is a diagram showing one example of an offset adding circuit in the receiver circuit of FIG. 29.

FIG. 29 is a block diagram showing a sixth embodiment of a receiver circuit according to the present invention, and FIG. 30 is a diagram showing one example of an offset adding circuit in the receiver circuit of FIG. 29.

As can be seen from a comparison with FIG. 28 showing the fifth embodiment, in the sixth embodiment shown in FIG. 29 the control signal CS (CS2) from the phase comparator 50 is not only supplied directly to the changing point detection phase adjusting timing signal generating circuit 42, but also supplied as the control signal CS1 to the data detection phase adjusting timing signal generating circuit 41 via the offset adding circuit (offset adjusting circuit) 6.

As shown in FIG. 30, the offset adding circuit 6 is configured as an adder which receives the control signal CS (CS2) at an input INA and an offset add value OAV at an input INB and outputs OUT=INA+INB as an output OUTPUT (CS1). At this time, the feedback loop consisting of the changing point detection/discrimination circuit 2, phase comparator circuit 50, and changing point detection phase adjusting timing signal generating circuit 42 operates in such a manner that the changing point detection signal is phase synchronized to the changing point of the input signal.

More specifically, when the control signal CS output from the phase comparator 50 is a 6-bit digital code "000001", if the offset add value OAV is "1", the offset adding circuit 6 produces an output "000010". That is, the 6-bit code "000001" is supplied as the control signal CS2 to the changing point detection phase adjusting timing signal generating circuit 42, while the 6-bit code "000010" with one bit added to the 6-bit code of the control signal CS2 is supplied as the control signal CS1 to the data detection phase adjusting timing signal generating circuit 41.

As a result, the data detection/discrimination circuit 1 detects data by using the data detection clock CLKd' whose phase is delayed compared with the data detection clock CLKd in the prior art receiver circuit (see, for example, FIG. 23). The offset add value OAV applied to the offset adding circuit 6 is chosen to give the optimum offset according to the position where the signal amplitude is maximum by considering, for example, the characteristic of the signal transmission path, etc.

Figure 31:
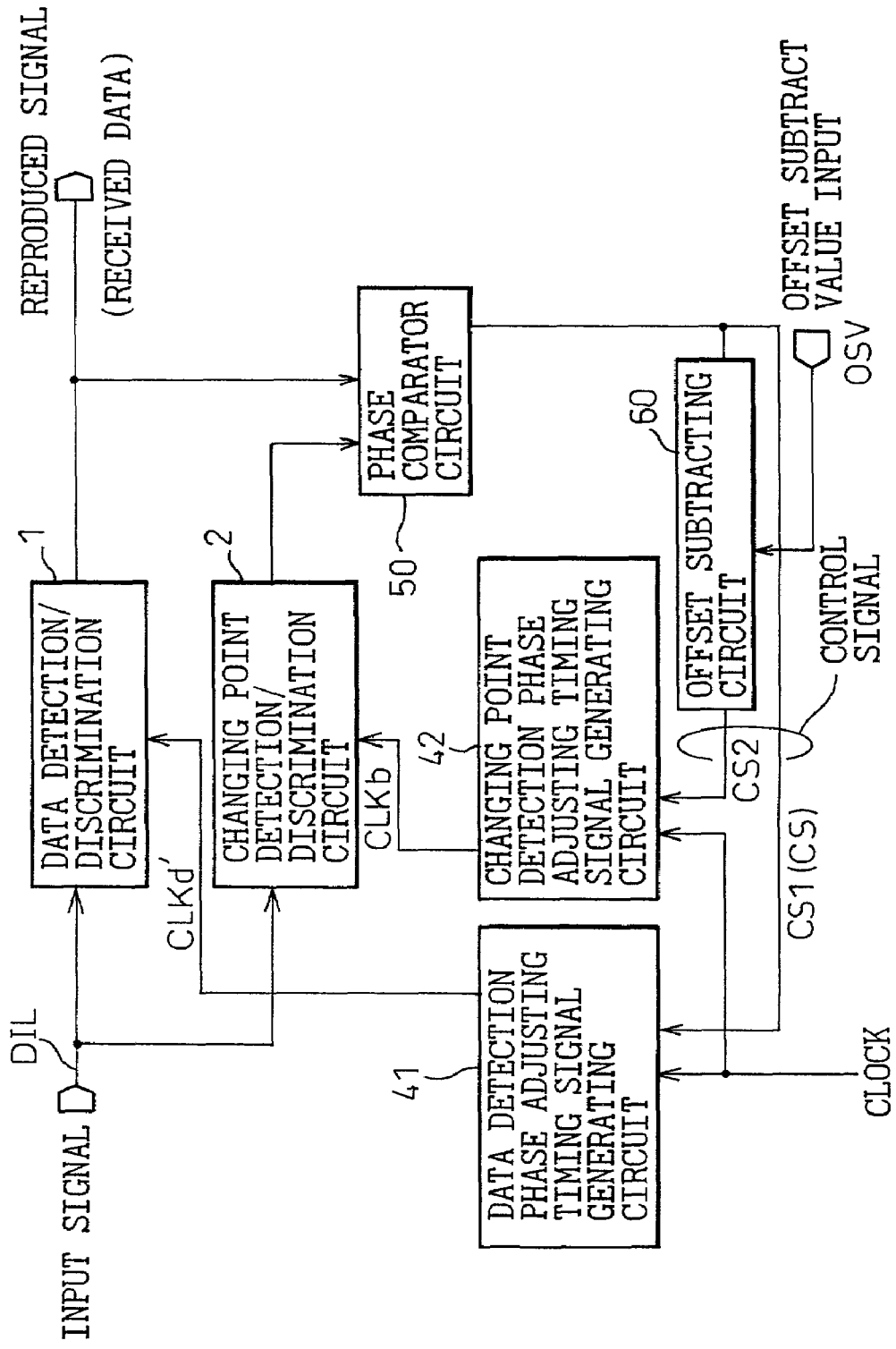
FIG. 31 is a block diagram showing a seventh embodiment of a receiver circuit according to the present invention.
Figure 32:
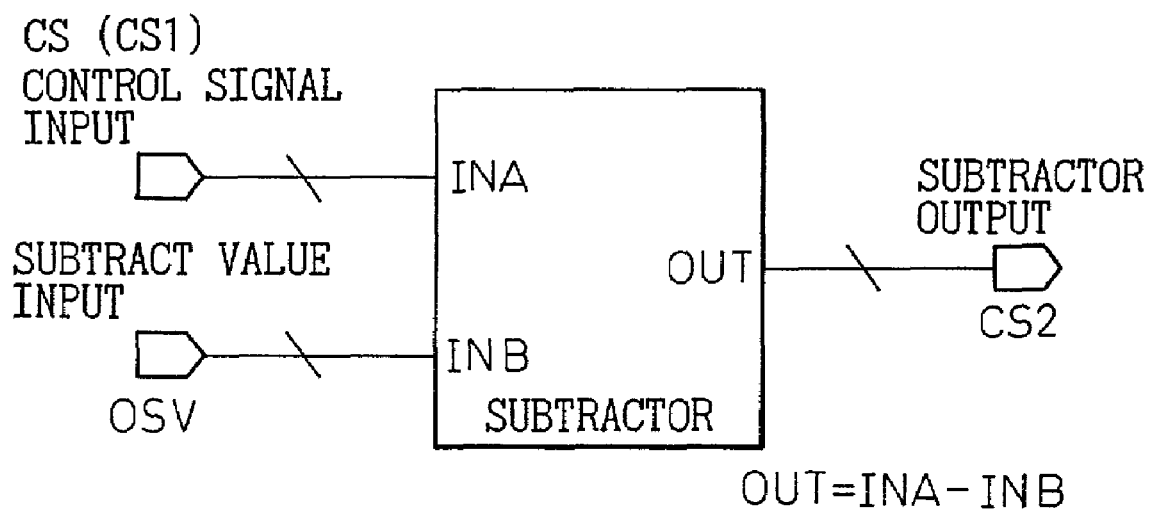
FIG. 32 is a diagram showing one example of an offset subtracting circuit in the receiver circuit of FIG. 31.

FIG. 31 is a block diagram showing a seventh embodiment of a receiver circuit according to the present invention, and FIG. 32 is a diagram showing one example of an offset subtracting circuit in the receiver circuit of FIG. 31.

In the seventh embodiment, the offset adding circuit 6 provided on the input side of the data detection phase adjusting timing signal generating circuit 41 in the sixth embodiment is replaced by the offset subtracting circuit (offset adjusting circuit) 60 which, in the seventh embodiment, is provided on the input side of the changing point detection phase adjusting timing signal generating circuit 42.

That is, in the seventh embodiment, the control signal CS (CS1) from the phase comparator 50 is not only supplied directly to the data detection phase adjusting timing signal generating circuit 41, but also supplied as the control signal CS2 to the changing point detection phase adjusting timing signal generating circuit 42 via the offset subtracting circuit 60.

As shown in FIG. 32, the offset subtracting circuit 60 is configured as a subtractor which receives the control signal CS (CS1) at an input INA and an offset subtract value OSV at an input INB and outputs OUT=INA−INB as an output OUTPUT (CS2). At this time, the feedback loop consisting of the changing point detection/discrimination circuit 2, phase comparator circuit 50, offset subtracting circuit 60, and changing point detection phase adjusting timing signal generating circuit 42 operates in such a manner that the changing point detection signal is phase synchronized to the changing point of the input signal.

More specifically, when the control signal CS output from the phase comparator 50 is a 6-bit digital code "000001", if the offset subtract value OSV is "1", the offset subtracting circuit 60 produces an output "000000". That is, the 6-bit code "000001" is supplied as the control signal CS1 to the data detection phase adjusting timing signal generating circuit 41, while the 6-bit code "000000", with one bit subtracted from the 6-bit code of the control signal CS1 is supplied as the control signal CS2 to the changing point detection phase adjusting timing signal generating circuit 42.

As a result, as in the foregoing sixth embodiment, the data detection/discrimination circuit 1 detects data by using the data detection clock CLKd' whose phase is delayed compared with the data detection clock CLKd in the prior art receiver circuit. The offset subtract value OSV applied to the offset subtracting circuit 60 is, of course, chosen to give the optimum offset according to the position where the signal amplitude is maximum by considering, for example, the characteristic of the signal transmission path, etc.

Figure 33:
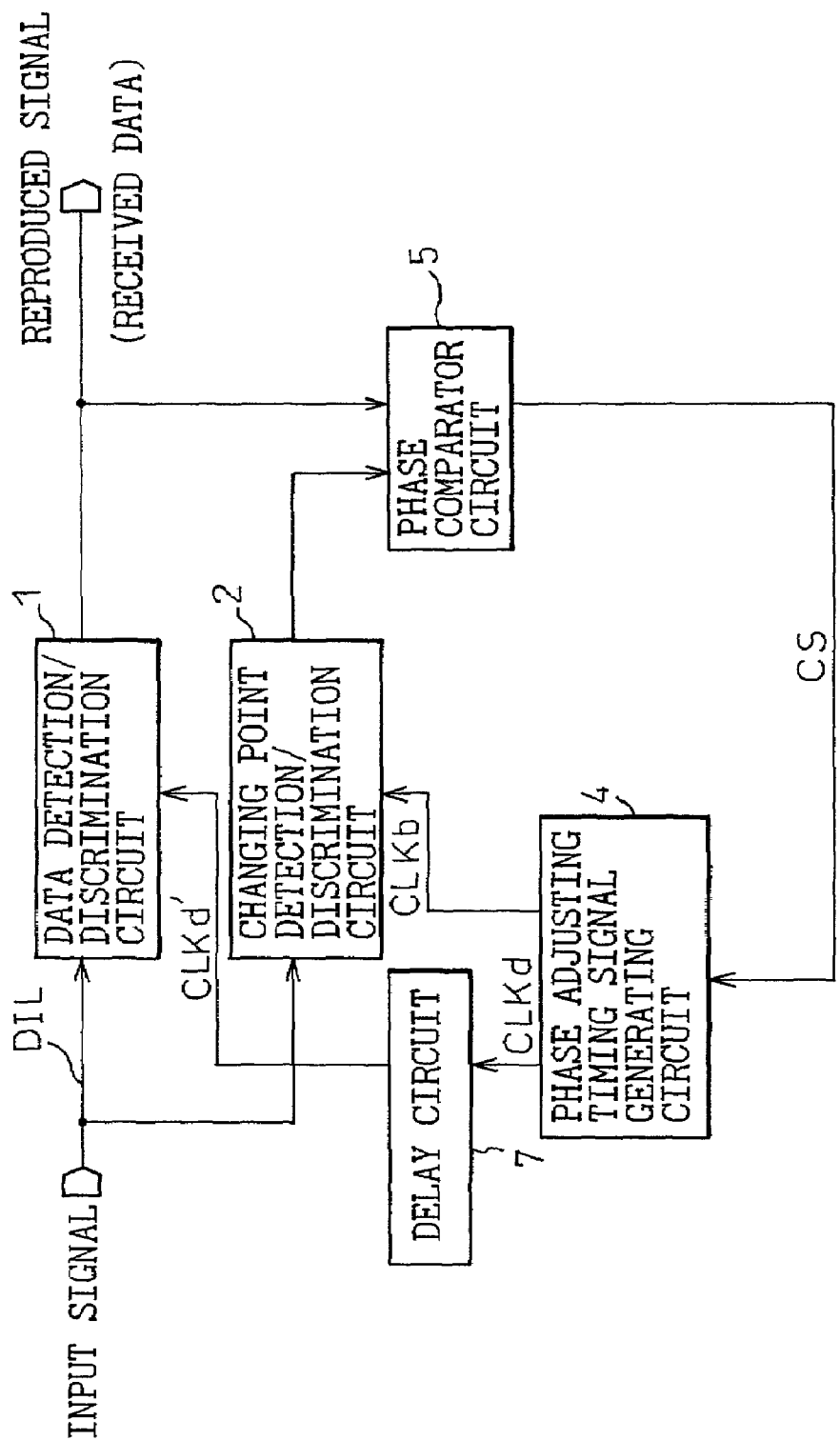
FIG. 33 is a block diagram showing an eighth embodiment of a receiver circuit according to the present invention.
Figure 34:
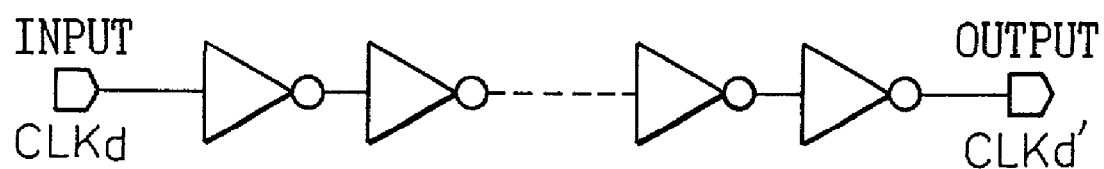
FIG. 34 is a diagram showing one example of a delay circuit in the receiver circuit of FIG. 33.

FIG. 33 is a block diagram showing an eighth embodiment of a receiver circuit according to the present invention, and FIG. 34 is a diagram showing one example of a delay circuit in the receiver circuit of FIG. 33.

As shown in FIG. 33, the eighth embodiment differs from the prior art shown in FIG. 16 in that the data detection clock CLKd, which was supplied directly to the data detection/discrimination circuit 101 in FIG. 16, is delayed through the delay circuit 7 and supplied as a data detection clock CLKd' to the data detection/discrimination circuit 1.

As shown in FIG. 34, the delay circuit 7 is constructed, for example, by connecting a plurality (even number) of inverters in series. In the eighth embodiment, the number of inverter stages that determines the amount of delay introduced by the delay circuit 7 is determined, for example, according to the position where the signal amplitude is maximum by considering the characteristic of the signal transmission path, etc.

Figure 35:
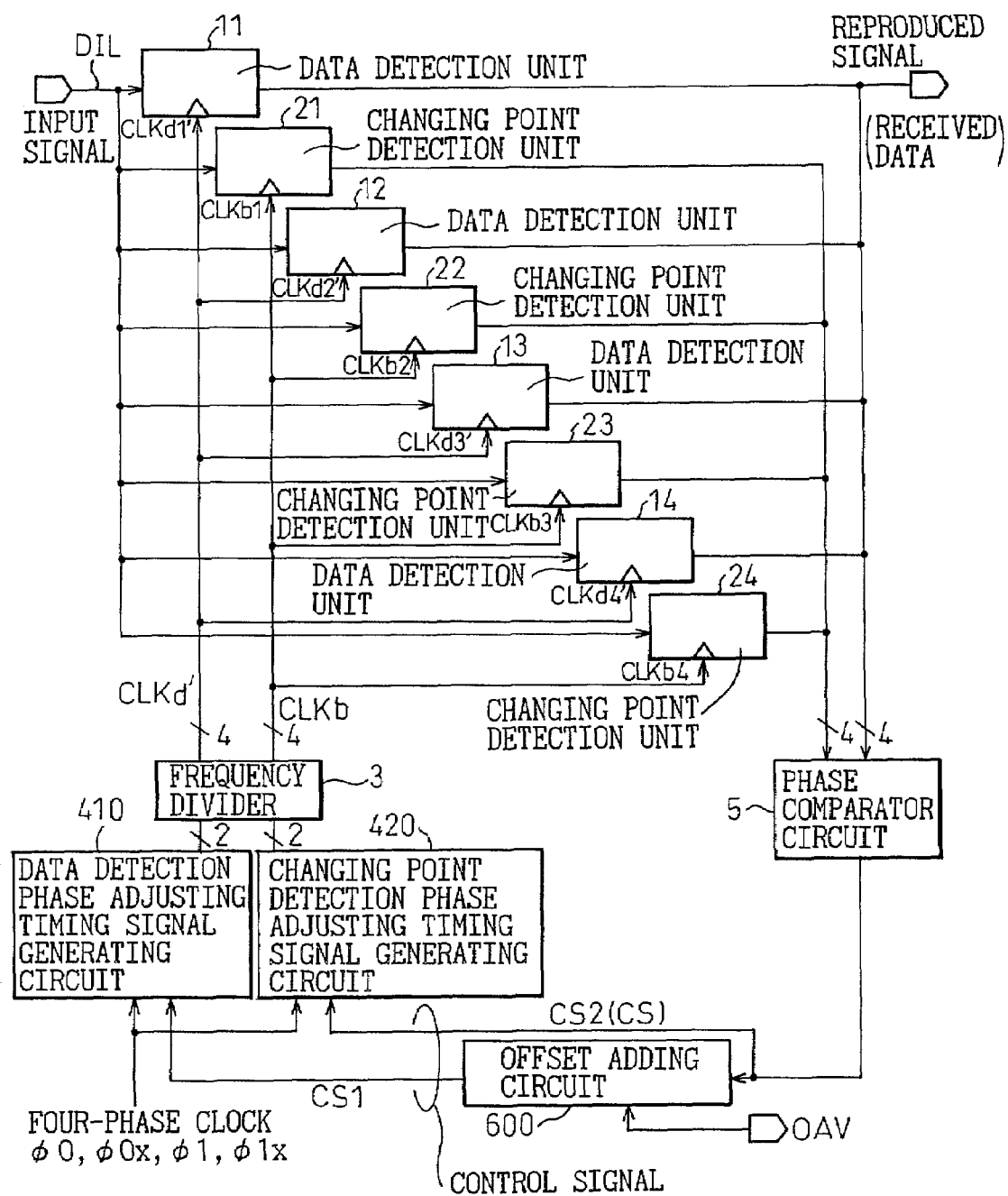
FIG. 35 is a block diagram showing a ninth embodiment of a receiver circuit according to the present invention.

FIG. 35 is a block diagram showing a ninth embodiment of a receiver circuit according to the present invention, wherein the circuit is configured as a 4-way×2 type interleaving circuit. In FIG. 35, reference numerals 11 to 14 are data detection units, 21 to 24 are changing point detection units, 3 is a frequency divider, 410 is a data detection phase adjusting timing signal generating circuit, 420 is a changing point detection phase adjusting timing signal generating circuit, 5 is a phase comparator circuit, and 600 is an offset adding circuit.

The ninth embodiment shown in FIG. 35 corresponds to the sixth embodiment previously shown in FIGS. 29 and 30, and is one where the present invention is applied to the prior art shown in FIGS. 20 and 21. That is, in the receiver circuit of the ninth embodiment, two pairs of differential clock signals (φ0, φ0x; φ1, φ1x) are supplied as a four-phase input signal (four-phase clock) to the data detection phase adjusting timing signal generating circuit 410 and the changing point detection phase adjusting timing signal generating circuit 420, which integrate and compare the weighted sum of the input signals and generate, through the frequency divider 3, clocks (CLKd' and CLKb) of the phases corresponding to the weight value.

The clock CLKd' consists of four data detection unit control signals CLKd1', CLKd2', CLKd3', and CLKd4', each with a phase difference of 90 degrees, for example, and these control signals are supplied to the respective data detection units (data detection/discrimination circuits) 11 to 14. These data detection clocks CLKd' (CLKd1' to CLKd4') are delayed in phase compared with the data detection clocks CLKd (CLKd1 to CLKd4) in the prior art; as a result, accurate signal reproduction can be accomplished even when the position where a sufficient signal amplitude can be obtained is displaced from the center position of the data (the center of the data eye) in the lagging direction, for example, due to the characteristic of the signal transmission line, etc.

The clock CLKb is the same as that in the prior art and consists of four changing point detection unit control signals CLKb1, CLKb2, CLKb3, and CLKb4, each with a phase difference of 90 degrees, for example, and these control signals are supplied to the respective changing point detection units (changing point detection/discrimination circuits) 21 to 24.

Accordingly, when data is supplied on the data input line DIL at a rate of 2.5 G [bps], for example, the data detection units 11 to 14 and changing point detection units 21 to 24 perform interleaving by being driven with a 625-MHz clock. The data detection units 11 to 14 are each driven, for example, with a 625-MHz clock (data detection unit control signal CLKd1, CLKd2, CLKd3, or CLKd4), detect and discriminate the data carried in the input signal supplied on the data input line DIL, and output the data as received data (reproduced signal). The outputs of the data detection units 11 to 14 are also supplied to the phase comparator circuit 5.

Likewise, the changing point detection units 21 to 24 are each driven, for example, with a 625-MHz clock (changing point detection unit control signal CLKb1, CLKb2, CLKb3, or CLKb4), detect and discriminate data changing points appearing in the input signal supplied on the data input line DIL, and supply the result to the phase comparator circuit 5.

The phase comparator circuit 5 compares the outputs of the data detection units 11 to 14 and changing point detection units 21 to 24, and outputs the control signal CS (CS2). The control signal CS from the phase comparator circuit 5 is not only supplied as the control signal CS2 to the changing point detection phase adjusting timing signal generating circuit 420, but also supplied as the control signal CS1 to the data detection phase adjusting timing signal generating circuit 410 via the offset adding circuit 600.

The configuration of the offset adding circuit 600 is the same as that in the previously described sixth embodiment (see FIG. 30). In the ninth embodiment also, rather than providing the offset adding circuit 600 on the input side of the data detection phase adjusting timing signal generating circuit 410, an offset subtracting circuit may be provided on the input side of the changing point detection phase adjusting timing signal generating circuit 420. Each of the above embodiments has been described by dealing with the case where the timing of the data detection clock is delayed, but it is also possible to configure the circuit so that the timing of the data detection clock is advanced, depending, for example, on the circuit configuration, transmitted signal waveform, etc.

Figure 36:
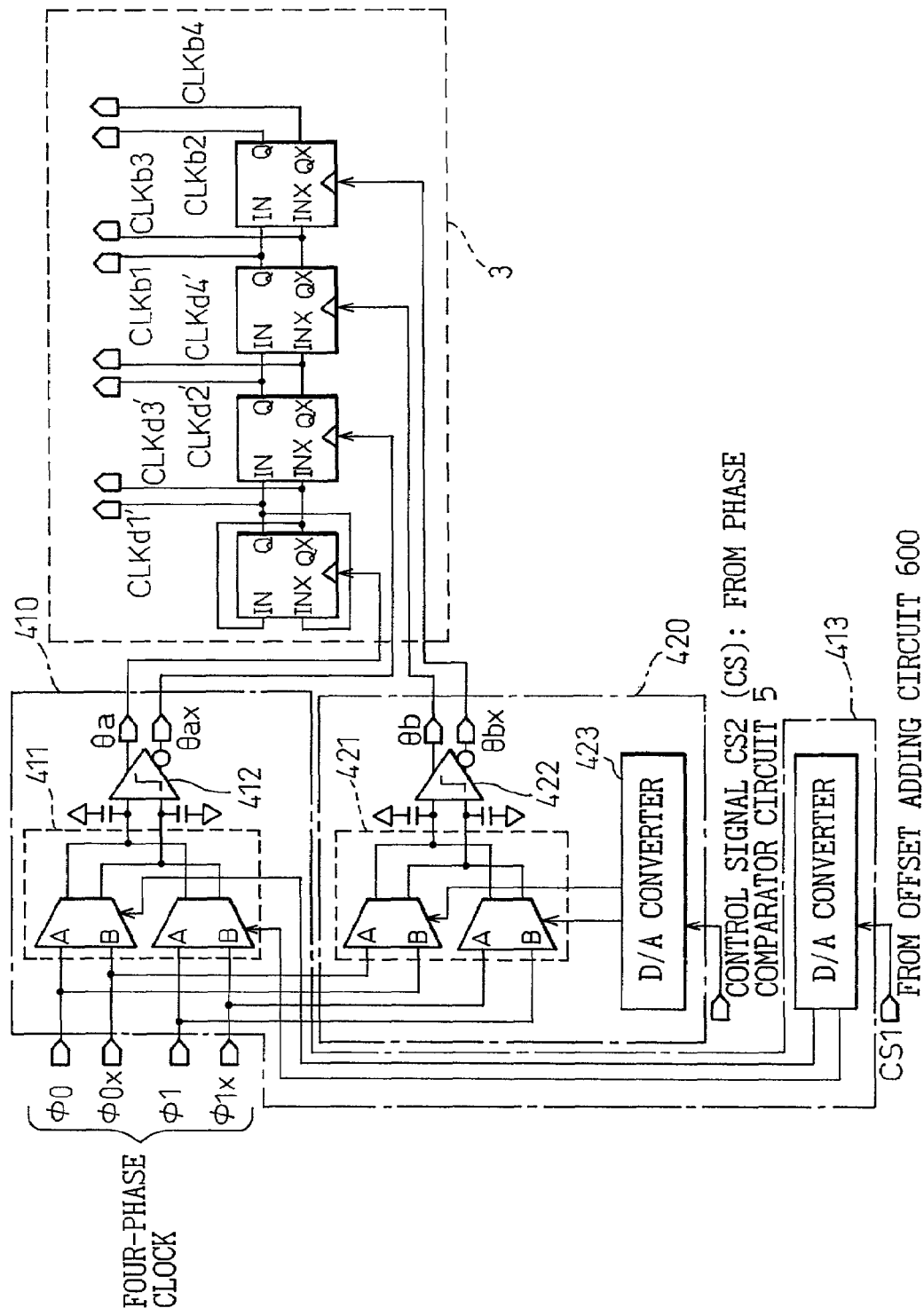
FIG. 36 is a block circuit diagram showing one example of a phase adjusting timing signal generating block in the receiver circuit of FIG. 35.

FIG. 36 is a block circuit diagram showing one example of the phase adjusting timing signal generating block in the receiver circuit of FIG. 35.

As shown in FIG. 36, the phase adjusting timing signal generating block comprises the data detection phase adjusting timing signal generating circuit 410, changing point detection phase adjusting timing signal generating circuit 420, and frequency divider 3. The data detection phase adjusting timing signal generating circuit 410 comprises a mixer circuit (phase mixer) 411, a comparator 412, and a D/A converter 413; likewise, the changing point detection phase adjusting timing signal generating circuit 420 comprises a mixer circuit 421, a comparator 422, and a D/A converter 423.

The mixer circuit 411 receives clock signals (four-phase clock) φ0, φ0x; φ1, φ1x and an output of the D/A converter 413, and applies a weight (the output of the D/A converter 413) to each clock signal and thereby generates clocks θa and θax each having a phase intermediate between the respective clocks; likewise, the mixer circuit 421 receives the clock signals (four-phase clock) φ0, φ0x; φ1, φ1x and an output of the D/A converter 423, and applies a weight to each clock signal and thereby generates clocks θb and θbx each having a phase intermediate between the respective clocks. These clocks θa, θax and θb, θbx are supplied to the frequency divider 3, which outputs the data detection clock CLKd' (CLKd1', CLKd2', CLKd3', CLKd4') and changing point detection clock CLKb (CLKb1, CLKb2, CLKb3, CLKb4).

The D/A converter 423 receives directly the output (control signal CS (CS2)) of the phase comparator circuit 5, converts the phase adjusting weight into current, and supplies the current to the mixer circuit 421. On the other hand, the D/A converter 413 receives the control signal CS1, created by the offset adding circuit 600 by adding the offset adding value OAV to the output (control signal CS) of the phase comparator 5, converts the phase adjusting weight into current, and supplies the current to the mixer circuit 411.

In this way, according to each embodiment of the receiver circuit (clock recovery circuit) of the present invention, signal reproduction accuracy is enhanced by shifting (adjusting) the timing of the data detection clock from the phase center of the input signal to the phase position where a sufficient and effective signal amplitude can be obtained.

As described in detail above, according to the second mode (fifth to ninth embodiments) of the receiver circuit (clock recovery circuit) of the present invention, the input signal reproduction timing can be taken at the position where the amplitude of the input signal can be sufficiently secured, and the error rate of signal reproduction can thus be improved.

Many different embodiments of the present invention may be constructed without departing from the spirit and scope of the present invention, and it should be understood that the present invention is not limited to the specific embodiments described in this specification, except as defined in the appended claims.

What is claimed is:

1. A clock recovery circuit comprising:
    a boundary detection/discrimination circuit for detecting or discriminating a boundary in an input signal in accordance with a first signal, and which performs clock recovery by controlling the timing of said first signal in accordance with said detected boundary, wherein boundary detection timing in said boundary detection/discrimination circuit is varied by controlling said first signal; and
    a phase interpolator for delaying said first signal by different times, and wherein modulation is applied on a code supplied to said phase interpolator.

2. The clock recovery circuit as claimed in claim 1, wherein said boundary detection/discrimination circuit detects said boundary in said input signal at a timing variably displaced from the timing at which said boundary should otherwise be detected.

3. The clock recovery circuit as claimed in claim 1, wherein said boundary detection/discrimination circuit detects said boundary in said input signal at a predetermined timing.

4. The clock recovery circuit as claimed in claim 1, wherein said boundary detection/discrimination circuit detects said boundary in said input signal at a dynamically controlled timing.

5. The clock recovery circuit as claimed in claim 1, further comprising a digital-to-analog converter for applying modulation on said code supplied to said phase interpolator, and wherein weighted modulation is applied by said digital-to-analog converter.

6. The clock recovery circuit as claimed in claim 1, further comprising:
    a variable delay circuit for delaying said first signal by different times.

7. A clock recovery circuit comprising:
    a boundary detection/discrimination circuit for detecting or discriminating a boundary in an input signal in accordance with a first signal, and which performs clock recovery by controlling the timing of said first signal in accordance with said detected boundary, wherein boundary detection timing in said boundary detection/discrimination circuit is varied by controlling said first signal,
    wherein said boundary detection/discrimination circuit includes a plurality of boundary detection units,
    wherein each of said boundary detection units detects a boundary in accordance with a boundary detection unit control signal, and
    wherein said each boundary detection unit detects said boundary in said input signal at a timing variably displaced from the timing at which said boundary should otherwise be detected; and
    a plurality of buffers for delaying said boundary detection unit control signals by respectively different times.

8. The clock recovery circuit as claimed in claim 7, wherein said each boundary detection unit detects said boundary in said input signal at a predetermined timing.

9. The clock recovery circuit as claimed in claim 7, wherein said each boundary detection unit detects said boundary in said input signal at a dynamically controlled timing.

10. The clock recovery circuit as claimed in claim 7, wherein said plurality of buffers are constructed to provide different delay times by adjusting the ratio between the size of a capacitor as a load and the size of a transistor for driving said load in each of said buffers.

11. A clock recovery circuit comprising:
    a boundary detection/discrimination circuit for detecting or discriminating a boundary in an input signal in accordance with a first signal, and which performs clock recovery by controlling the timing of said first signal in accordance with said detected boundary, wherein boundary detection timing in said boundary detection/discrimination circuit is varied by controlling said first signal,
    wherein said boundary detection/discrimination circuit includes a plurality of boundary detection units,
    wherein each of said boundary detection units detects a boundary in accordance with a boundary detection unit control signal, and
    wherein said each boundary detection unit detects said boundary in said input signal at a timing variably displaced from the timing at which said boundary should otherwise be detected; and
    a phase interpolator for delaying said boundary detection unit control signals by respectively different times, and wherein modulation is applied on a code supplied to said phase interpolator.

12. The clock recovery circuit as claimed in claim 11, further comprising a digital-to-analog converter for applying modulation on said code supplied to said phase interpolator, and wherein weighted modulation is applied by said digital-to-analog convert.

13. A clock recovery circuit comprising:
    a boundary detection/discrimination circuit for detecting or discriminating a boundary in an input signal in accordance with a first signal, and which performs clock recovery by controlling the timing of said first signal in accordance with said detected boundary, wherein boundary detection timing in said boundary detection/discrimination circuit is varied by controlling said first signal,
    wherein said boundary detection/discrimination circuit includes a plurality of boundary detection units,
    wherein each of said boundary detection units detects a boundary in accordance with a boundary detection unit control signal, and
    wherein said each boundary detection unit detects said boundary in said input signal at a timing variably displaced from the timing at which said boundary should otherwise be detected; and a plurality of variable delay circuits for delaying said boundary detection unit control signals by respectively different times.

14. A receiver circuit comprising: a data detection/discrimination circuit for detecting or discriminating data carried in an input signal; a boundary detection/discrimination circuit for detecting or discriminating a boundary appearing in said input signal; a phase comparator for receiving outputs from said data detection/discrimination circuit and said boundary detection/discrimination circuit, and for comparing the phases of said outputs; a clock signal generating circuit for receiving an output from said phase comparator, and for supplying a first internal clock to said data detection/discrimination circuit and a second internal clock to said boundary detection/discrimination circuit; and a boundary skew generating circuit for varying boundary detection timing in said boundary detection/discrimination circuit by controlling a skew given to said second internal clock.

15. The receiver circuit as claimed in claim 14, wherein said boundary skew generating circuit supplies said boundary detection/discrimination circuit with said second internal clock whose timing has been variably displaced from the timing at which said boundary in said input signal should otherwise be detected.

16. The receiver circuit as claimed in claim 14, wherein said boundary skew generating circuit gives a predetermined skew to said second internal clock.

17. The receiver circuit as claimed in claim 14, wherein said boundary skew generating circuit gives a dynamically varying skew to said second internal clock.

18. The receiver circuit as claimed in claim 14, wherein said boundary skew generating circuit includes a phase interpolator for delaying said second internal clock by different times, and wherein said skew is controlled by applying modulation on a code supplied to said phase interpolator.

19. The receiver circuit as claimed in claim 18, wherein said phase interpolator includes a digital-to-analog converter for applying modulation on said code, and wherein weighted modulation is applied by said digital-to-analog converter.

20. The receiver circuit as claimed in claim 14, wherein said boundary skew generating circuit includes a variable delay circuit for delaying said second internal clock by different times.

21. The receiver circuit as claimed in claim 14, wherein said boundary detection/discrimination circuit includes a plurality of boundary detection units, and wherein each of said boundary detection units detects a boundary in accordance with a boundary detection unit control signal.

22. The receiver circuit as claimed in claim 21, wherein said data detection/discrimination circuit includes a plurality of data detection units, and said first internal clock includes a plurality of data detection unit control signals of different phases, and wherein each of said data detection units performs interleaving with each of said boundary detection units in accordance with each of said boundary detection unit control signals.

23. The receiver circuit as claimed in claim 21, wherein said boundary skew generating circuit supplies said each boundary detection unit with a corresponding one of said boundary detection unit control signals whose timing has been variably displaced from the timing at which said boundary in said input signal should otherwise be detected.

24. The receiver circuit as claimed in claim 23, wherein said boundary skew generating circuit gives a predetermined skew to said each boundary detection unit control signal.

25. The receiver circuit as claimed in claim 23, wherein said boundary skew generating circuit gives a dynamically varying skew to said each boundary detection unit control signal.

26. The receiver circuit as claimed in claim 23, wherein said boundary skew generating circuit includes a plurality of buffers for delaying said boundary detection unit control signals by respectively different times.

27. The receiver circuit as claimed in claim 23, wherein said boundary skew generating circuit includes a phase interpolator for delaying said boundary detection unit control signals by respectively different times, and wherein said skew is controlled by applying modulation on a code supplied to said phase interpolator.

28. The receiver circuit as claimed in claim 27, wherein said phase interpolator includes a digital-to-analog converter for applying modulation on said code, and wherein weighted modulation is applied by said digital-to-analog converter.

29. The receiver circuit as claimed in claim 23, wherein said boundary skew generating circuit includes a plurality of variable delay circuits for delaying said boundary detection unit control signals by respectively different times.

30. A clock recovery circuit for recovering a clock from an input signal by using a phase adjusting timing signal generating circuit in a feedback loop, comprising a displacing circuit for displacing an output of said phase adjusting timing signal generating circuit from an approximate center position of said input signal.

31. The clock recovery circuit as claimed in claim 30, wherein a clock output from said data detection phase adjusting timing signal generating circuit has a phase timing advanced or delayed with respect to the approximate center position of said input signal.

32. The clock recovery circuit as claimed in claim 30, wherein said phase adjusting timing signal generating circuit includes a data detection phase adjusting timing signal generating circuit for generating a clock for detecting data carried in said input signal, and a changing point detection phase adjusting timing signal generating circuit for generating a clock for detecting a data changing point in said input signal.

33. The clock recovery circuit as claimed in claim 32, further comprising an offset adding circuit, and wherein a control signal is supplied to said changing point detection phase adjusting timing signal generating circuit, while the same control signal is supplied via said offset adding circuit to said data detection phase adjusting timing signal generating circuit.

34. The clock recovery circuit as claimed in claim 32, further comprising an offset subtracting circuit, and wherein a control signal is supplied to said data detection phase adjusting timing signal generating circuit, while the same control signal is supplied via said offset subtracting circuit to said changing point detection phase adjusting timing signal generating circuit.

35. The clock recovery circuit as claimed in claim 32, further comprising a delay circuit, and wherein the output of said data detection phase adjusting timing signal generating circuit is delayed through said delay circuit and said delayed output is used for said data detection.

36. The clock recovery circuit as claimed in claim 32, wherein the clock output from said data detection phase adjusting timing signal generating circuit includes a plurality of data detection unit control signals which are used in a plurality of data detection units to detect data carried in said input signal, and the clock output from said changing point detection phase adjusting timing signal generating circuit includes a plurality of changing point detection unit control signals which are used in a plurality of changing point detection units to detect data changing points in said input signal, and wherein each of said data detection units performs interleaving with each of said changing point detection units.

37. The clock recovery circuit as claimed in claim 36, wherein each of said plurality of data detection unit control signals has a phase timing advanced or delayed with respect to the approximate center position of said input signal.

38. A clock recovery circuit for recovering a clock from an input signal by using a phase adjusting timing signal generating circuit in a feedback loop, comprising a displacing circuit for displacing an output of said phase adjusting timing signal generating circuit from an equispaced phase relationship.

39. The clock recovery circuit as claimed in claim 38, wherein a clock output from said data detection phase adjusting timing signal generating circuit has a phase timing advanced or delayed with respect to the approximate center position of said input signal.

40. The clock recovery circuit as claimed in claim 38, wherein said phase adjusting timing signal generating circuit includes a data detection phase adjusting timing signal generating circuit for generating a clock for detecting data carried in said input signal, and a changing point detection phase adjusting timing signal generating circuit for generating a clock for detecting a data changing point in said input signal.

41. The clock recovery circuit as claimed in claim 40, further comprising an offset adding circuit, and wherein a control signal is supplied to said changing point detection phase adjusting timing signal generating circuit, while the same control signal is supplied via said offset adding circuit to said data detection phase adjusting timing signal generating circuit.

42. The clock recovery circuit as claimed in claim 40, further comprising an offset subtracting circuit, and wherein a control signal is supplied to said data detection phase adjusting timing signal generating circuit, while the same control signal is supplied via said offset subtracting circuit to said changing point detection phase adjusting timing signal generating circuit.

43. The clock recovery circuit as claimed in claim 40, further comprising a delay circuit, and wherein the output of said data detection phase adjusting timing signal generating circuit is delayed through said delay circuit and said delayed output is used for said data detection.

44. The clock recovery circuit as claimed in claim 40, wherein the clock output from said data detection phase adjusting timing signal generating circuit includes a plurality of data detection unit control signals which are used in a plurality of data detection units to detect data carried in said input signal, and the clock output from said changing point detection phase adjusting timing signal generating circuit includes a plurality of changing point detection unit control signals which are used in a plurality of changing point detection units to detect data changing points in said input signal, and wherein each of said data detection units performs interleaving with each of said changing point detection units.

45. The clock recovery circuit as claimed in claim 44, wherein each of said plurality of data detection unit control signals has a phase timing advanced or delayed with respect to the approximate center position of said input signal.

46. A receiver circuit comprising: a data detection/discrimination circuit for detecting or discriminating data carried in an input signal; a changing point detection/discrimination circuit for detecting or discriminating a changing point appearing in said input signal; a phase comparator circuit for receiving outputs from said data detection/discrimination circuit and said changing point detection/discrimination circuit, and for comparing the phases of said outputs; and a clock signal generating circuit for receiving an output from said phase comparator circuit, and for supplying a first internal clock to said data detection/discrimination circuit and a second internal clock to said changing point detection/discrimination circuit, and wherein: said receiver circuit includes a displacing circuit for displacing the phase relationship between said first internal clock and said second internal clock from an equispaced phase relationship.

47. The receiver circuit as claimed in claim 46, wherein said first internal clock has a phase timing advanced or delayed with respect to an approximate center position of said input signal.

48. The receiver circuit as claimed in claim 46, wherein said clock signal generating circuit includes a data detection phase adjusting timing signal generating circuit for generating said first internal clock, and a changing point detection phase adjusting timing signal generating circuit for generating said second internal clock.

49. The receiver circuit as claimed in claim 48, wherein said phase comparator circuit supplies a first control signal to said data detection phase adjusting timing signal generating circuit and a second control signal, different from said first control signal, to said changing point detection phase adjusting timing signal generating circuit.

50. The receiver circuit as claimed in claim 48, further comprising an offset adjusting circuit, and wherein the output of said phase comparator circuit is supplied to one of said data detection phase adjusting timing signal generating circuit and said changing point detection phase adjusting timing signal generating circuit, while the same output is supplied via the offset adjusting circuit to the other one of said data detection phase adjusting timing signal generating circuit and said changing point detection phase adjusting timing signal generating circuit.

51. The receiver circuit as claimed in claim 50, wherein said offset adjusting circuit is an offset adding circuit, and said offset adding circuit is provided between said phase comparator circuit and said data detection phase adjusting timing signal generating circuit.

52. The receiver circuit as claimed in claim 50, wherein said offset adjusting circuit is an offset subtracting circuit, and said offset subtracting circuit is provided between said phase comparator circuit and said changing point detection phase adjusting timing signal generating circuit.

53. The receiver circuit as claimed in claim 46, further comprising a timing adjusting circuit, and wherein an output of said clock signal generating circuit is supplied to one of said data detection phase adjusting timing signal generating circuit and said changing point detection phase adjusting timing signal generating circuit, while the same output is supplied via the timing adjusting circuit to the other one of said data detection phase adjusting timing signal generating circuit and said changing point detection phase adjusting timing signal generating circuit.

54. The receiver circuit as claimed in claim 53, wherein said timing adjusting circuit is a delay circuit, and said delay circuit is provided between said data detection phase adjusting timing signal generating circuit and said clock signal generating circuit.

55. The receiver circuit as claimed in claim 46, wherein said data detection/discrimination circuit includes a plurality of data detection units, said changing point detection/discrimination circuit includes a plurality of changing point detection units, said first internal clock includes a plurality of data detection unit control signals of different phases, and said second internal clock includes a plurality of changing point detection unit control signals of different phases, and wherein each of said data detection units performs interleaving with each of said changing point detection units.

56. The receiver circuit as claimed in claim 55, wherein each of said plurality of data detection unit control signals has a phase timing advanced or delayed with respect to an approximate center position of said input signal.

* * * * *